(12) United States Patent
Tokunaga et al.

(10) Patent No.: US 7,118,949 B2
(45) Date of Patent: *Oct. 10, 2006

(54) SEMICONDUCTOR INTEGRATED CIRCUIT DEVICE AND METHOD FOR MANUFACTURING THE SAME

(75) Inventors: Takafumi Tokunaga, Iruma (JP); Makoto Yoshida, Ome (JP); Fumio Ootsuka, Tokorozawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/989,260

(22) Filed: Nov. 17, 2004

(65) Prior Publication Data

US 2005/0070099 A1    Mar. 31, 2005

Related U.S. Application Data

(60) Continuation of application No. 09/970,664, filed on Oct. 5, 2001, now Pat. No. 6,838,320, which is a division of application No. 09/423,047, filed as application No. PCT/JP97/01501 on May 1, 1997, now abandoned.

(51) Int. Cl.
*H01L 21/336* (2006.01)
(52) U.S. Cl. .................. 438/197; 438/216; 438/275
(58) Field of Classification Search .............. 438/128, 438/197, 216, 257, 258, 261, 266, 275, 591
See application file for complete search history.

(56) References Cited

U.S. PATENT DOCUMENTS

| | | |
|---|---|---|
| 4,769,686 A | 9/1988 | Horiuchi et al. |
| 5,311,048 A | 5/1994 | Takahashi et al. |
| 5,610,854 A | 3/1997 | Ema |
| 5,672,533 A | 9/1997 | Arima et al. |
| 5,700,705 A | 12/1997 | Meguro et al. |
| 5,937,300 A | 8/1999 | Sekine et al. |
| 6,025,620 A | 2/2000 | Kimura et al. |
| 6,031,288 A | 2/2000 | Todorobaru et al. |
| 6,043,118 A | 3/2000 | Suwanai et al. |
| 6,069,038 A | 5/2000 | Hashimoto et al. |
| 6,150,689 A | 11/2000 | Narui et al. |
| 6,160,282 A | 12/2000 | Merrill |

(Continued)

FOREIGN PATENT DOCUMENTS

JP            1264257        10/1989

(Continued)

OTHER PUBLICATIONS

Fujii et al, "A Thermally Stable Ti-W Salicide For Deep-Submicron Logic With Embedded DRAM", IEDM, 1996, pp. 451-454.

*Primary Examiner*—Kevin M. Picardat
(74) *Attorney, Agent, or Firm*—Antonelli, Terry, Stout and Kraus, LLP.

(57) ABSTRACT

In a semiconductor integrated circuit device having a system-on-chip structure in which a DRAM and a logic integrated circuit are mixedly mounted on a chip, a silicide layer is formed on the surfaces of the source and the drain of a MISFET of a direct peripheral circuit of the DRAM, the surfaces of the source and the drain of a MISFET of an indirect peripheral circuit of the DRAM, and the surfaces of the source and the drain of a MISFET of the logic integrated circuit, and the silicide layer is not formed on the surfaces of the source and the drain of a memory cell selective MISFET of the memory cell of the DRAM.

13 Claims, 29 Drawing Sheets

U.S. PATENT DOCUMENTS

| | | |
|---|---|---|
| 6,288,430 B1 | 9/2001 | Oda |
| 6,297,135 B1 | 10/2001 | Talwar et al. |
| 6,326,657 B1 | 12/2001 | Ohkawa |
| 6,376,304 B1 | 4/2002 | Matsuoka et al. |
| 6,838,320 B1 * | 1/2005 | Tokunaga et al. ........... 438/128 |
| 2001/0050399 A1 | 12/2001 | Kikushima |
| 2002/0011619 A1 | 1/2002 | Ohkawa |
| 2002/0137281 A1 | 9/2002 | Watanabe |

FOREIGN PATENT DOCUMENTS

| | | |
|---|---|---|
| JP | 669445 | 3/1994 |
| JP | 7297298 | 11/1995 |
| JP | 8321591 | 12/1996 |
| JP | 9116113 | 5/1997 |
| TW | 279259 | 6/1996 |

* cited by examiner

SEMICONDUCTOR INTEGRATED CIRCUIT DEVICE AND METHOD FOR MANUFACTURING THE SAME

CROSS REFERENCE TO RELATED APPLICATIONS

This application is a continuation of application Ser. No. 09/970,664, filed on Oct. 5, 2001, now U.S. Pat. No. 6,838,320, which is a divisional application of Ser. No. 09/423,047, filed Aug. 2, 2000, now abandoned, which is a 371 of PCT International Application No. PCT/JP97/01501, filed May 1, 1997, the contents of each of which are incorporated herein by reference.

BACKGROUND OF THE INVENTION

The present invention relates to a semiconductor integrated circuit device and a method for manufacturing the same, and in particular, a technology effectively applicable to a semiconductor integrated circuit device having a system-on-chip structure in which a DRAM (Dynamic Random Access Memory) and a logic integrated circuit are mixedly mounted on a chip.

In recent years, in a high technology field such as multimedia, information communication and the like, a movement has become active to speed up a data transfer rate, to save a space (to increase a packaging density), and to reduce a power consumption by realizing a system-on-chip structure in which a microcomputer, a DRAM, an ASIC, and the like are mixedly mounted on one chip.

One of means for speeding up a logic integrated circuit part is a technology of forming a silicide layer over the surfaces of a source and a drain. However, if the silicide layer is formed over the source and drain of a memory cell selective MISFET of a memory cell of the DRAM, a leak current increases and deteriorates a refresh property.

In the case of mounting a DRAM and a logic integrated circuit on one chip while keeping the performance of the DRAM and the performance of the logic integrated circuit, it is necessary to develop a new mixed-mounting process suitable for the one chip structure.

It is an object of the present invention to provide a technology realizing one chip of a DRAM and a logic integrated circuit while keeping the performance of the DRAM and the performance of the logic integrated circuit, in a semiconductor integrated circuit device having a system-on-chip structure in which a DRAM and a logic integrated circuit are mixedly mounted on one chip.

The above-mentioned object and other objects, and new features of the present invention will become clear from the following description of the present specification and the accompanying drawings.

SUMMARY OF THE INVENTION

The typical aspect of the present invention will be described below in brief.

The present invention is a semiconductor integrated circuit device having a system-on-chip structure in which a DRAM and a logic integrated circuit are mixedly mounted on a chip, characterized in that a silicide layer is formed on the surfaces of a source and a drain of a MISFET of a direct peripheral circuit of the DRAM, on the surfaces of a source and a drain of a MISFET of an indirect peripheral circuit of the DRAM, and on the surfaces of a source and a drain of a MISFET of a logic integrated circuit, and that the suicide layer is not formed on the surfaces of a source and a drain of a memory cell selective MISFET of a memory cell of the DRAM, whereby a high speed operation of the logic integrated circuit can be realized and deterioration in refresh characteristics of the DRAM can be avoided.

In addition to this, other aspects of the present invention to be disclosed in this application will be described below item by item.

A semiconductor integrated circuit device in accordance with the present invention has: a DRAM having a memory array including many memory cells each of which has a memory cell selective MISFET and an information storing capacitive element connected in series thereto, a direct peripheral circuit including a MISFET, and an indirect peripheral circuit including a MISFET, the DRAM being formed at least in the first region of the main surface of a semiconductor substrate; and a logic integrated circuit including a MISFET and formed in the second region of the main surface of the semiconductor substrate, wherein a silicide layer is formed on the surfaces of the source and the drain of the MISFET of the direct peripheral circuit of the DRAM, on the surfaces of the source and the drain of the MISFET of the indirect peripheral circuit of the DRAM, and on the surfaces of the source and the drain of the MISFET of the logic integrated circuit, and wherein the silicide layer is not formed on the surfaces of the source and the drain of the memory cell selective MISFET of the memory cell of the DRAM.

In the semiconductor integrated circuit device in accordance with the present invention, the thickness of a gate oxide film of the memory cell selective MISFET and the thickness of a gate oxide film of the MISFET of the direct peripheral circuit are larger than the thickness of a gate oxide film of the MISFET of the indirect peripheral circuit and the thickness of a gate oxide film of the MISFET of the logic integrated circuit.

In the semiconductor integrated circuit device in accordance with the present invention, the direct peripheral circuit includes sense amplifiers, row decoders, and a column decoder, and the indirect peripheral circuit includes an input/output circuit, a logic circuit, an address selective circuit, a reading amplifier, and a writing amplifier.

In the semiconductor integrated circuit device in accordance with the present invention, the direct peripheral circuit of the DRAM includes sense amplifiers, row decoders, and a column decoder, a logic circuit, an address selective circuit, a reading amplifier, and a writing amplifier, and the indirect peripheral circuit includes an input/output circuit.

In the semiconductor integrated circuit device in accordance with the present invention, the silicide layer is made of Ti silicide.

In the semiconductor integrated circuit device in accordance with the present invention, each of the gate electrode of the memory cell selective MISFET of the DRAM, the gate electrode of the MISFET of the direct peripheral circuit, the gate electrode of the MISFET of the indirect peripheral circuit, and the gate electrode of the MISFET of the logic integrated circuit has a sheet resistance of $2\Omega/\square$ or less.

In the semiconductor integrated circuit device in accordance with the present invention, each of the gate electrode of the memory cell selective MISFET of the DRAM, the gate electrode of the MISFET of the direct peripheral circuit, the gate electrode of the MISFET of the indirect peripheral circuit, and the gate electrode of the MISFET of the logic integrated circuit is made of two laminated films of a metal film and a polycrystalline silicon film.

In the semiconductor integrated circuit device in accordance with the present invention, a bit line connected to the memory cell selective MISFET of the DRAM, a first layer wiring connected to the MISFET of the direct peripheral circuit, a first layer wiring connected to the MISFET of the indirect peripheral circuit, and a first layer wiring connected to the MISFET of the logic integrated circuit are the same layer wiring manufactured in the same process.

In the semiconductor integrated circuit device in accordance with the present invention, each of a bit line connected to the memory cell selective MISFET of the DRAM, a first layer wiring connected to the MISFET of the direct peripheral circuit, a first layer wiring connected to the MISFET of the indirect peripheral circuit, and a first layer wiring connected to the MISFET of the logic integrated circuit has a sheet resistance of 2Ω/□ or less.

In the semiconductor integrated circuit device in accordance with the present invention, each of the direct peripheral circuit, the indirect peripheral circuit, and the logic integrated circuit includes a complementary MISFET.

The semiconductor integrated circuit device in accordance with the present invention has: a DRAM having a memory array including many memory cells each of which has a memory cell selective MISFET and an information storing capacitive element connected in series thereto, a direct peripheral circuit including a MISFET, and an indirect peripheral circuit including a MISFET, the DRAM being formed at least in the first region of the main surface of a semiconductor substrate; and a logic integrated circuit including a MISFET and formed in the second region of the main surface of the semiconductor substrate, wherein a silicide layer is formed on the surfaces of the source and the drain of the MISFET of the indirect peripheral circuit of the DRAM and on the surfaces of the source and the drain of the MISFET of the logic integrated circuit, and wherein the silicide layer is not formed on the surfaces of the source and the drain of the memory cell selective MISFET of the memory cell of the DRAM and on the surfaces of the source and the drain of the MISFET of the direct peripheral circuit of the DRAM.

A method for manufacturing a semiconductor integrated circuit device in accordance with the present invention includes the steps of:

(a) forming a first gate oxide film over a part of the first region of the main surface of the semiconductor substrate, and forming a second gate oxide film thinner than the first gate oxide film over the other part of the first region and over the second region thereof;

(b) forming a gate electrode of a memory cell selective MISFET and a gate electrode of the MISFET of the direct peripheral circuit over a part of the first region, forming a gate electrode of the MISFET of the indirect peripheral circuit over the other part of the first region, and forming a gate electrode of the MISFET of the logic integrated circuit over the second region;

(c) forming a source and a drain of the memory cell selective MISFET, a source and a drain of the MISFET of the direct peripheral circuit, a source and a drain of the MISFET of the indirect peripheral circuit, and a source and a drain of the MISFET of the logic integrated circuit;

(d) exposing the surfaces of the source and the drain of the MISFET of the direct peripheral circuit, the surfaces of the source and the drain of the MISFET of the indirect peripheral circuit, and the surfaces of the source and the drain of the MISFET of the logic integrated circuit, and covering the surfaces of the source and the drain of the memory cell selective MISFET with an insulating film, and then depositing a metal film over the main surface of the semiconductor substrate; and (e) forming a silicide layer near each of interfaces between the metal film and each of the source and the drain of the MISFET of the direct peripheral circuit, and between the metal film and each of the source and the drain of the MISFET of the indirect peripheral circuit, and between the metal film and each of the source and the drain of the MISFET of the logic integrated circuit, by heat-treating the semiconductor substrate.

DETAILED DESCRIPTION OF THE PREFERRED EMBODIMENTS

Figure 1:
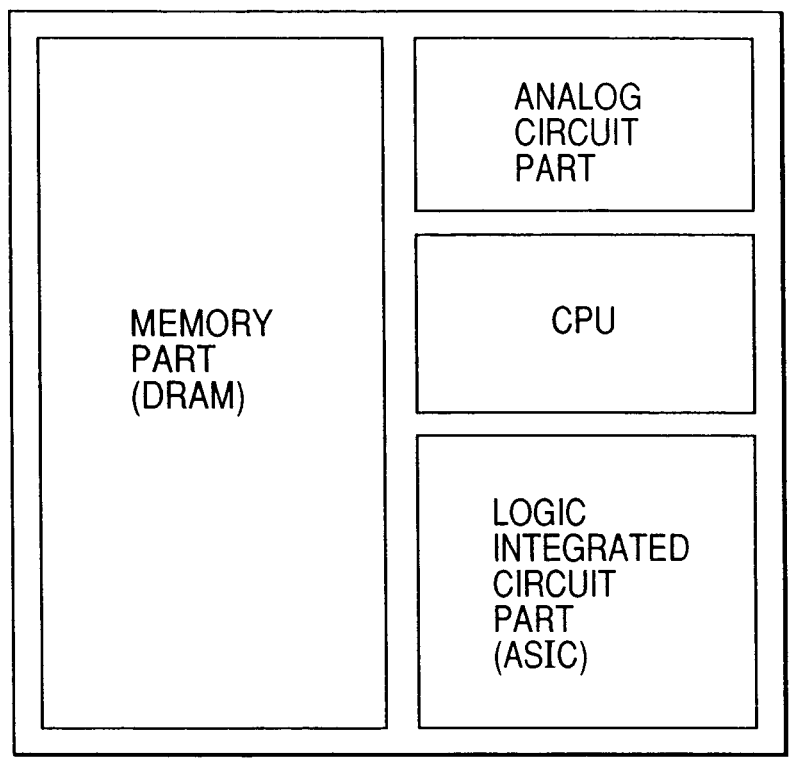
FIG. 1 is an illustration of the general constitution of a semiconductor chip showing a semiconductor integrated circuit device of the preferred embodiment in accordance with the present invention.

The preferred embodiments in accordance with the present invention will be described below in detail. In this respect, the same reference characters designate parts having the same functions throughout the drawings for illustrating the preferred embodiments, and the description thereof will be omitted.

As shown in FIG. 1, a semiconductor integrated circuit device of the present preferred embodiment is a microcomputer in which a CPU (information processing part), a memory part having a DRAM, a logic integrated circuit part having an ASIC, and an analog circuit part are formed on the main surface of the same semiconductor chip.

Figure 2:
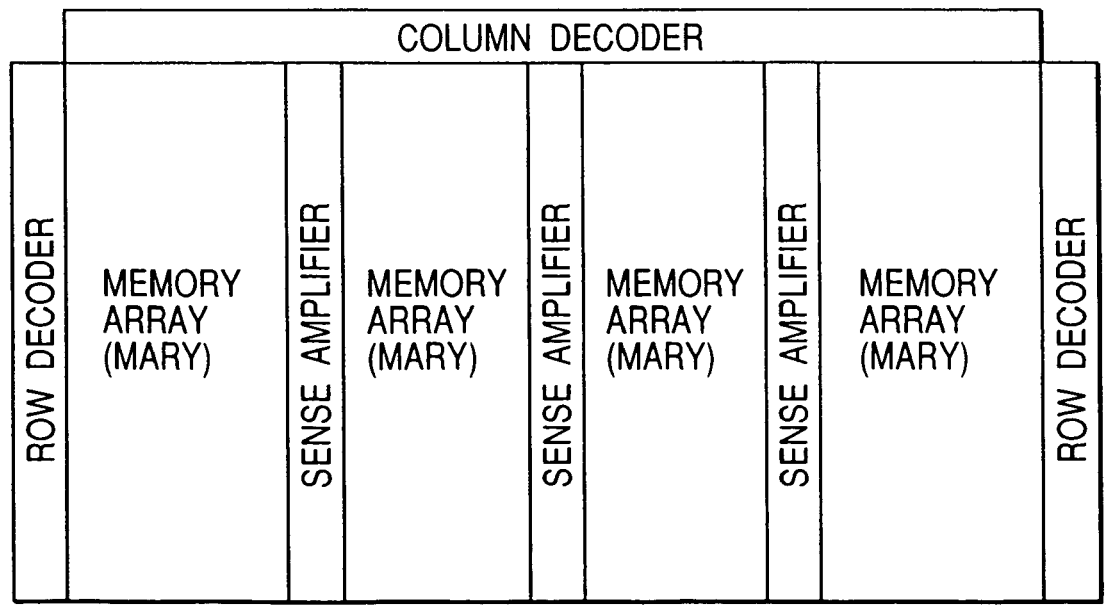
FIG. 2 is an illustration of the constitution of the memory array and the direct peripheral circuit of a DRAM of the memory part of the semiconductor integrated circuit device.

As shown in FIG. 2, the DRAM of the memory part of the microcomputer described above includes a direct peripheral circuit having memory arrays (MARY), sense amplifiers, row decoders, and a column decoder, which are adjacent to the memory arrays (MARY), and an indirect peripheral circuit having an input/output circuit, a logic circuit, an address selective circuit, a reading amplifier, and a writing amplifier, which are not shown in the drawings.

The memory array (MARY) of the DRAM has a plurality of word lines WL, a plurality of bit lines BL, and a plurality of memory cells arranged at the points of intersection of these lines, all of which are described below. One memory cell memorizing one bit information has one information storing capacitive element C and one memory cell selective MISFETQs connected in series thereto. One of the source and the drain of the memory cell selective MISFETQs is electrically connected to the information storing capacitive element C, and the other is electrically connected to the bit line BL.

Figure 3:
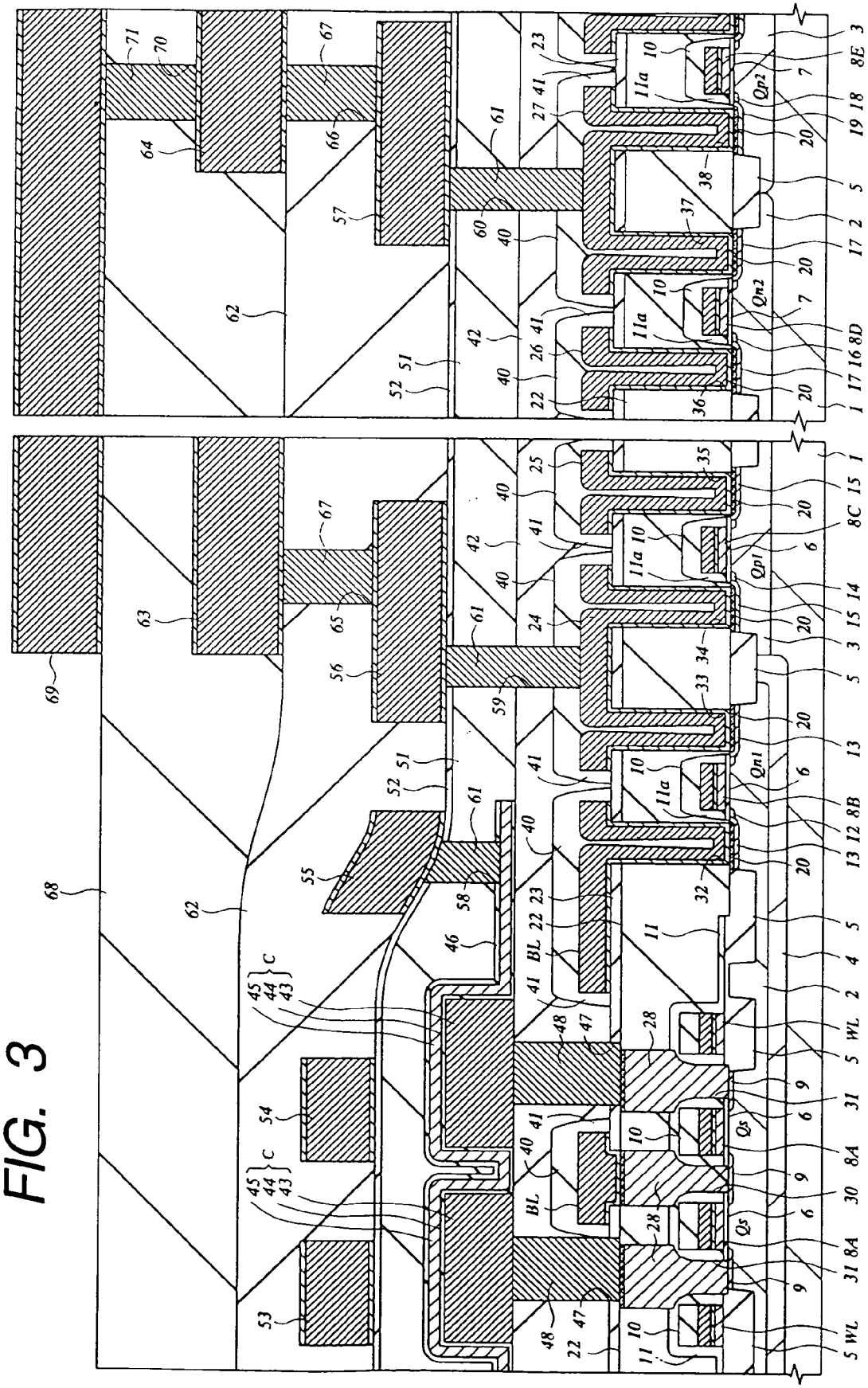
FIG. 3 is a cross-sectional view of a main part of a semiconductor substrate showing some parts of the memory part and the logic integrated circuit part of the semiconductor integrated circuit device.

The left side in FIG. 3 (a first region) is a cross-sectional view of a main part of a semiconductor substrate showing a part of the memory arrays (MARY) of the DRAM of the memory part of the microcomputer described above and a part of the direct peripheral circuit adjacent to them, and the right side in FIG. 3 (a second region) is a cross-sectional view of the main part of the semiconductor substrate showing a part of the logic integrated circuit part.

A p-type well 2 and an n-type well 3 are formed in the first region and the second region of the semiconductor substrate 1 made of a p-type single-crystal silicon. Although not defined in particular, the p-type well 2 common to the memory array (MARY) and a part of the direct peripheral circuit is electrically separated from the p-type semiconductor substrate 1 by an n-type semiconductor region 4 formed on the bottom of the p-type well 2 so as to prevent the influence of noises caused by a circuit formed in the other region of the semiconductor substrate 1.

On the surface of the p-type well 2 and on the surface of the n-type well 3, an element-separating groove 5 is formed. The element-separating groove 5 is constituted by burying a silicon oxide film in a groove made on the semiconductor substrate 1, and the top surface thereof is planarized so that it is almost the same level as the top surface of the active regions of the p-type well 2 and the n-type well 3.

In the active region of the p-type well 2 of the memory array (MARY), memory cells are formed. Each memory cell has a memory cell selective MISFETQs constituted in an n-channel type and an information storing capacitive element C formed on the top of the memory cell selective MISFETQs and connected in series to the memory cell selective MISFETQs. That is, this memory cell is constituted in a stacked capacitor structure in which the information storing capacitive element C is arranged on the top of the memory cell selective MISFETQs.

The memory cell selective MISFETQs has a first gate oxide film 6, a gate electrode 8A integrally formed with a word line WL, a source and a drain (n-type semiconductor region 9). The thickness of the first gate oxide film 6 is about 7 to 8 nm. The gate electrode 8A (word line WL) is made of three laminated conductive films of a polycrystalline silicon film doped with n-type impurity (for example, P, or phosphorus) and having low resistance, a TiN (titanium nitride) film and a W (tungsten) film, and its sheet resistance is not more than 2Ω/□. On the top of the gate electrode 8A, a silicon nitride film 10 is formed and a silicon nitride film 11 is formed on a side wall thereof.

In the active region of the p-type well 2 of the direct peripheral circuit, an n-channel type MISFETQn1 is formed, and in the active region of the n-type well 3 of the direct peripheral circuit, a p-channel type MISFETQp1 is formed. That is, this direct peripheral circuit has a CMOS (Complementary Metal Oxide Semiconductor) circuit (complementary MISFET circuit) of a combination of the n-channel type MISFETQn1 and the p-channel type MISFETQp1.

The n-channel type MISFETQn1 has a first gate oxide film 6, a gate electrode 8B, a source, and a drain. The thickness of the first gate oxide film 6 is the same (about 7 to 8 nm) as that of the first gate oxide film 6 of the memory cell selective MISFETQs. The gate electrode 8B is made of the same conductive film as the gate electrode 8A (word line WL) of the memory cell selective MISFETQs, and its sheet resistance is not more than 2Ω/□. On the top of the gate electrode 8B, a silicon nitride film 10 is formed, and a side-wall spacer 11a of silicon nitride is formed on the side wall thereof. Each of the source and the drain of the n-channel type MISFETQn1 has a LDD (Lightly Doped Drain) structure made of an $n^-$-type semiconductor region 12 of low impurity concentration and an $n^+$-type semiconductor region 13 of high impurity concentration, and on the surface of the $n^+$-type semiconductor region 13, a Ti silicide (TiSi$_2$) layer 20 is formed.

The p-channel type MISFETQp1 has a first gate oxide film 6, a gate electrode 8C, a source and a drain. The thickness of the first gate oxide film 6 is the same (about 7 to 8 nm) as that of the first gate oxide film 6 of the memory cell selective MISFETQs. The gate electrode 8C is made of the same conductive film as the gate electrode 8A (word line WL) of the memory cell selective MISFETQs, and its sheet resistance is not more than 2Ω/□. On the top of the gate electrode 8C, a silicon nitride film 10 is formed, and a side-wall spacer 11a of silicon nitride is formed on the side wall thereof. Each of the source and the drain of the P-channel type MISFETQp1 has the LDD structure made of a $p^-$-type semiconductor region 14 of low impurity concentration and a $p^+$-type semiconductor region 15 of high impurity concentration, and on the surface of the $p^-$-type semiconductor region 15, a Ti silicide (TiSi$_2$) layer 20 is formed.

In the active region of the p-type well 2 of a logic integrated circuit part (a second region), an n-channel type MISFETQn2 is formed, and in the active region of the n-type well 3 of the logic integrated circuit part, a p-channel type MISFETQp2 is formed. That is, this logic integrated circuit part has a CMOS circuit of a combination of the n-channel type MISFETQn2 and the p-channel type MISFETQp2.

The n-channel type MISFETQn2 has a second gate oxide film 7, a gate electrode 8D, a source, and a drain. The thickness of the second gate oxide film 7 is smaller than that of the first gate oxide film 6 of the first region, and about 4 nm. The gate electrode 8D is made of the same conductive film as the gate electrode 8A (word line WL) of the memory cell selective MISFETQs, and its sheet resistance is not more than 2Ω/□. On the top of the gate electrode 8D, a silicon nitride film 10 is formed, and a side-wall spacer 11a of silicon, nitride is formed on the side wall thereof. Each of the source and the drain of the n-channel type MISFETQn2 has the LDD structure made of an $n^-$-type semiconductor region 16 of low impurity concentration and an $n^+$-type semiconductor region 17 of high impurity concentration, and on the surface of the $n^+$-type semiconductor region 17, a Ti silicide layer 20 is formed.

The p-channel type MISFETQp2 has a second gate oxide film 7, a gate electrode 8E, a source, and a drain. The thickness of the second gate oxide film 7 is the same (about 4 nm) as that of the second gate oxide film 7 of the n-channel type MISFETQn2. The gate electrode 8E is made of the same conductive film as the gate electrode 8A (word line WL) of the memory cell selective MISFETQs, and its sheet resistance is not more than 2Ω/□. On the top of the gate electrode 8E, a silicon nitride film 10 is formed, and a side-wall spacer 11a of silicon nitride is formed on the side wall thereof. Each of the source and the drain of the P-channel type MISFETQp2 has the LDD structure made of a $p^-$-type semiconductor region 18 of low impurity concentration and a $p^+$-type semiconductor region 19 of high impurity concentration, and on the surface of the $p^+$-type semiconductor region 19, a Ti suicide layer 20 is formed.

In the not-shown region of the memory part (the first region), the indirect peripheral circuit of the DRAM is formed, and this indirect peripheral circuit has a CMOS circuit of a combination of an n-channel type MISFET and a p-channel type MISFET.

The n-channel type MISFET of the indirect peripheral circuit has the same constitution as the n-channel type MISFETQn2 of the above-described logic integrated circuit part. That is, the n-channel type MISFET of the indirect peripheral circuit has the second gate oxide film 7 having a film thickness of about 4 nm, a gate electrode made of the same conductive film as the gate electrode 8A (word line WL) of the above-mentioned memory cell selective MISFETQs, and a source and a drain which have the LDD structure made of an n$^-$-type semiconductor region of low impurity concentration and an n$^+$-type semiconductor region of high impurity concentration, and on the surface of the n$^+$-type semiconductor region, a Ti silicide layer 20 is formed.

The p-channel type MISFET of the indirect peripheral circuit has the same constitution as the p-channel type MISFETQp2 of the above-described logic integrated circuit part. That is, the p-channel type MISFET of the indirect peripheral circuit has the second gate oxide film 7 having a film thickness of about 4 nm, a gate electrode made of the same conductive film as the gate electrode 8A (word line WL) of the above-mentioned memory cell selective MISFETQs, and a source and a drain which have the LDD structure made of a p$^-$-type semiconductor region of low impurity concentration and a p$^+$-type semiconductor region of high impurity concentration, and on the surface of the p$^+$-type semiconductor region, a Ti silicide layer 20 is formed.

The MISFET of the indirect peripheral circuit of the DRAM has the same constitution as the MISFET of the logic integrated circuit part. Therefore, its description will be omitted in the following.

On the top of each of the memory cell selective MISFETQs, the n-channel type MISFETQn1, and the p-channel type MISFETQp1 of the memory cell part, and on the top of each of the n-channel type MISFETQn2 and the p-channel type MISFETQp2 of the logic integrated circuit part, a silicon oxide film 22 is formed. The surface of the silicon oxide film 22 is planarized so that it is almost at the same level throughout the semiconductor substrate 1.

On the top of the silicon oxide film 22, a silicon oxide film 23 is formed. Over the silicon oxide film 23 of the memory part, a bit line BL and first layer wirings 24, 25 of the direct peripheral circuit are formed, and on the top of the silicon oxide film 23 of the logic integrated circuit part, first layer wirings 26, 27 of the logic integrated circuit are formed. Each of these bit line BL and the first layer wirings 24 to 27 has two laminated conductive films of a TiN film and a W film, and its sheet resistance is not more than 2Ω/□.

The bit line BL is electrically connected to one of the source and the drain (n-type semiconductor region 9) of the memory cell selective MISFETQs through a contact hole 30 in which a plug 28 is buried. The plug 28 is made of a polycrystalline silicon film doped with an n-type impurity (for example, P). One end of the bit line BL is electrically connected to one of the source and the drain (n$^+$-type semiconductor region 13) of the n-channel type MISFETQn1 of the direct peripheral circuit through a contact hole 32.

One end of the first layer wiring 24 of the direct peripheral circuit is electrically connected to the other of the source and the drain (n$^+$-type semiconductor region 13) of the n-channel type MISFETQn1 through a contact hole 33, and the other end of the first layer wiring 24 is electrically connected to one of the source and the drain (p$^+$-type semiconductor region 15) of the p-channel type MISFETQp1 through a contact hole 34. The first layer wiring 25 of the direct peripheral circuit is electrically connected to the other of the source and the drain (p$^+$-type semiconductor region 15) of the p-channel type MISFETQp1 through a contact hole 35.

The first layer wiring 26 of the logic integrated circuit is electrically connected to one of the source and the drain (n$^+$-type semiconductor region 17) of the n-channel type MISFETQn2 through a contact hole 36, and one end of the first layer wiring 27 of the logic integrated circuit is electrically connected to the other of the source and the drain (n$^+$-type semiconductor region 17) of the n-channel type MISFETQp2 through a contact hole 37. The other end of the first layer wiring 27 is electrically connected to one of the source and the drain (p$^+$-type semiconductor region 19) of the p-channel type MISFETQp2 through a contact hole 38.

On the top of the bit line BL and on the top of each of the first layer wirings 24 to 27, a silicon nitride film 40 is formed, and a side-wall spacer 41 made of silicon nitride film is formed on the side wall thereof. Further, on the top of the silicon nitride film 40 formed on the bit line BL and the first layer wirings 24 to 27, a silicon oxide film 42 is formed.

An information storing capacitive element C having a lower electrode (storing electrode) 43, a capacitive insulating film 44, and an upper electrode (plate electrode) 35 is formed on the top of the silicon oxide film 42 of the memory array (MARY). The lower electrode 43 of the information storing capacitive element C is made of a W film, and is electrically connected to the other of the source and the drain (n-type semiconductor region 9) of the memory cell selective MISFETQs through a through hole 47 in which a plug 48 made of a W (or polycrystalline silicon) film is buried and a contact hole 31 in which a plug 28 made of a polycrystalline silicon film is buried. The capacitive insulating film 44 is made of a tantalum oxide (Ta$_2$O$_5$) film, and the plate electrode 45 is made of a TiN film. On the top of the plate electrode 45, a silicon nitride film 46 is formed.

On the top of the information storing capacitive element C, a spin-on-glass film 51 and a silicon oxide film 52 are formed. On the top of the silicon oxide film 52 of the memory part, second layer wirings 53 to 56 are formed, and on the top of the silicon oxide film 52 of the logic integrated circuit part, a second layer wiring 57 is formed. These second layer wirings 53 to 57 are made of three laminated conductive films of a TiN film, an Aluminum alloy film, and a TiN film.

The second layer wiring 55 of the memory part is electrically connected to the upper electrode 45 of the information storing capacitive element C through a through hole 58 in which a plug 61 made of a W film is buried to supply a plate voltage (for example, Vdd/2) to the upper electrode 45. The second layer wiring 56 of the direct peripheral circuit is electrically connected to the first layer wiring 24 through a through hole 59 in which a plug 61 made of a W film is buried. The second layer wiring 57 of the logic integrated circuit part is electrically connected to the first layer wiring 27 through a through hole 60 in which a plug 61 made of a W film is buried.

On the top of each of the second layer wirings 53 to 57, a silicon oxide film 62 is formed, and further on the top of the silicon oxide film 62, a third layer wiring 63 of the direct peripheral circuit and a third layer wiring 64 of the logic integrated circuit part are formed. These third layer wirings 63, 64 are made of three laminated conductive films of a TiN film, an Aluminum alloy film, and a TiN film. The third layer wiring 63 of the direct peripheral circuit is electrically connected to the second layer wiring 56 through a through hole 65 in which a plug 67 made of a W film is buried. The third layer wiring 64 of the logic integrated circuit part is electrically connected to the second layer wiring 57 through a through hole 66 in which a plug 67 made of a W film is buried.

On the top of the third layer wirings 63, 64, a silicon oxide film 68 is formed, and further on the top of the silicon oxide film 68, a fourth layer wiring 69 of the logic integrated circuit part is formed. This fourth layer wiring 69 is made of three laminated conductive films of a TiN film, an Aluminum alloy film, and a TiN film. The fourth layer wiring 69 is electrically connected to the third layer wiring 64 through a through hole 70 in which a plug 71 made of a W film is buried.

On the top of the fourth layer wiring 69, about one to three layers of wirings of the logic integrated circuit part are formed, and further on the top of the layers, a passivating film made of two laminated insulating films of a silicon oxide film and a silicon nitride film is formed. However, these are not shown in the drawing.

Next, one example of a method for manufacturing the semiconductor integrated circuit device described above will be described with reference to FIG. 4 to FIG. 31.

Figure 4:
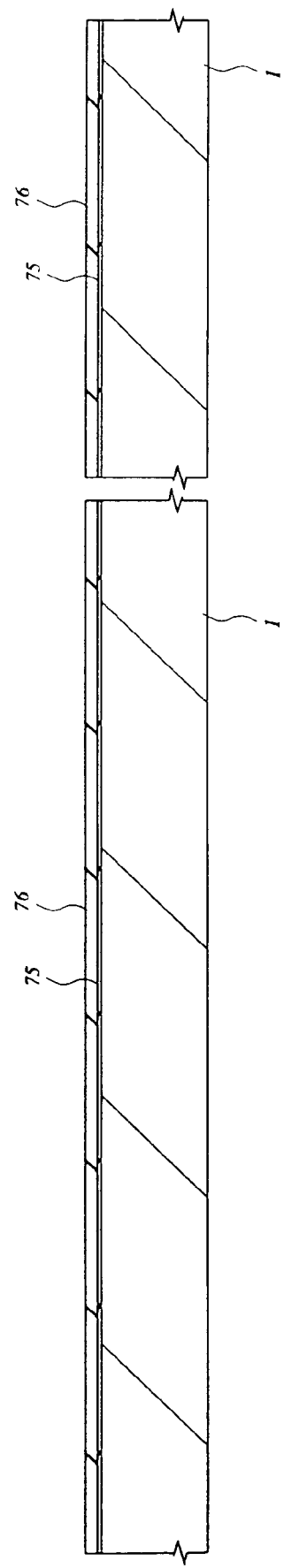
FIG. 4 to FIG. 30 are cross-sectional views of a main part of a semiconductor substrate showing a method for manufacturing the semiconductor integrated circuit device.
Figure 5:
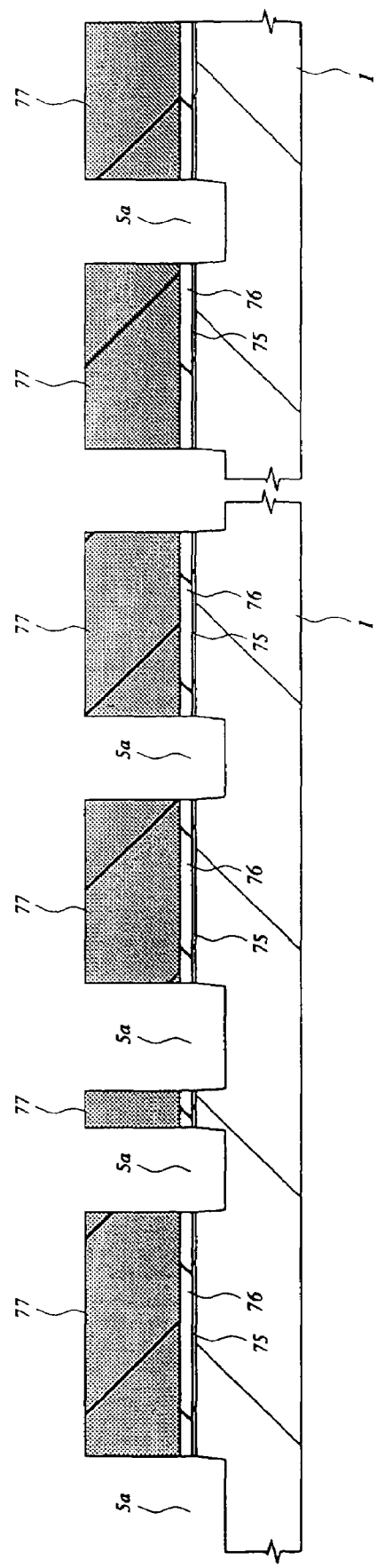

First, as shown in FIG. 4, a semiconductor substrate 1 made of p-type single-crystal silicon having a specific resistance of about 10 Ω cm is subjected to a heat treatment to form a silicon oxide film 75 having a thickness of about 10 to 30 nm on the surface of the substrate 1, and then a silicon nitride film 76 having a thickness of about 100 to 140 nm is deposited on the silicon oxide film 30 by a CVD (Chemical Vapor Deposition) method. Then, as shown in FIG. 5, the silicon nitride film 76, the silicon oxide film 75, and the semiconductor film 1 in the region where an element-separating region is to be formed are etched in succession by using a photoresist 77 formed on the silicon nitride film 76 as a mask to form a groove 5a having a depth of about 350 to 400 nm on the semiconductor substrate 1. A gas made of $CF_4+CHF_3+Ar$, or a gas made of $CF_4+Ar$ is used for etching the silicon nitride film 76. A gas made of $HBr+Cl_2+He+O_2$ is used for etching the semiconductor substrate 1.

Figure 6:
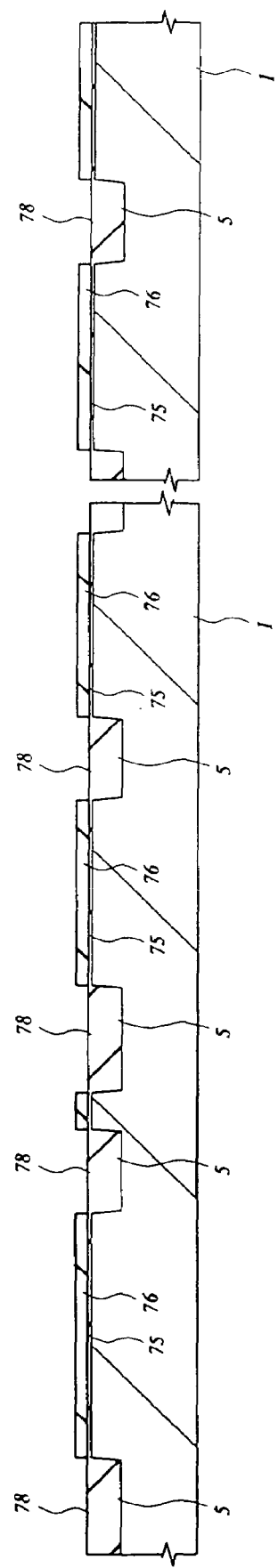

Then, as shown in FIG. 6, a silicon oxide film 78 deposited on the semiconductor substrate 1 by the CVD method is polished by a CMP (Chemical Mechanical Polishing) method and is left in the groove 5a to form an element-separating groove 5. Then, the semiconductor substrate 1 is subjected to heat treatment at about 1000° C. to densify the silicon oxide film 78 buried in the element-separating groove 5, and then the silicon nitride film 76 left on the semiconductor substrate 1 is removed by wet etching using a hot phosphoric acid.

Figure 7:
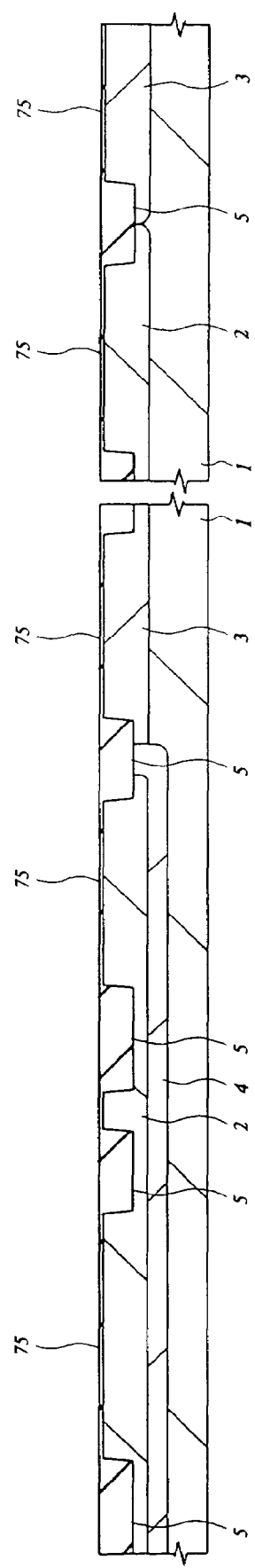

Next, as shown in FIG. 7, an n-type semiconductor region 4 is formed in the semiconductor substrate 1 of the region where the memory array (MARY) of the DRAM and a part of the direct peripheral circuit (n-channel type MISFETQn1) are to be formed, and then, a p-type well 2 is formed in the shallow portion of the n-type semiconductor region 4 and in the semiconductor substrate 1 of the region where a part of the logic integrated circuit part (n-channel type MISFETQn2) is to be formed, and a n-type well 3 is formed in the semiconductor substrate 1 of the region where the other part of the direct peripheral circuit of the DRAM (p-channel type MISFETQp1) is to be formed and in the semiconductor substrate 1 of the region where the other part of the logic integrated circuit part (p-channel type MISFETQp2) is to be formed. The n-type semiconductor region 4 is made by ion-implanting P (phosphorus) into the semiconductor substrate 1 and then by heat-treating the semiconductor substrate 1 at a temperature of about 1000° C. to elongate and diffuse the P. Also, the p-type well 2 and the n-type well 3 are made by ion-implanting P into a part of the semiconductor substrate 1 and B (boron) into the other part thereof, and then, by heat-treating the semiconductor substrate 1 at a temperature of about 950° C. to elongate and diffuse the P and the B.

Figure 8:
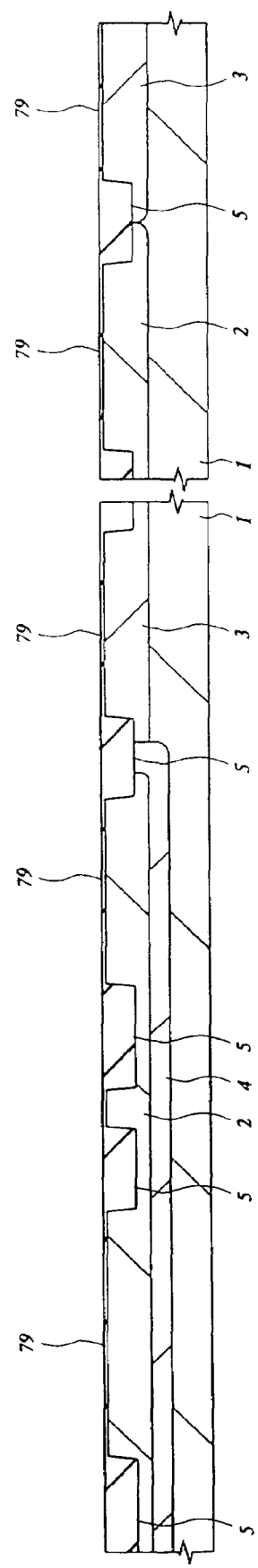

Then, the silicon oxide film 75 left on the surface of the p-type well 2 and on the surface of the n-type well 3 is removed by a HF (hydrofluoric acid)-based cleaning fluid, and then, as shown in FIG. 8, a clean gate oxide film 79 is formed on the surface of the p-type well 2 and on the surface of the n-type well 3 by a wet oxidation method at a temperature of about 800° C.

Figure 9:
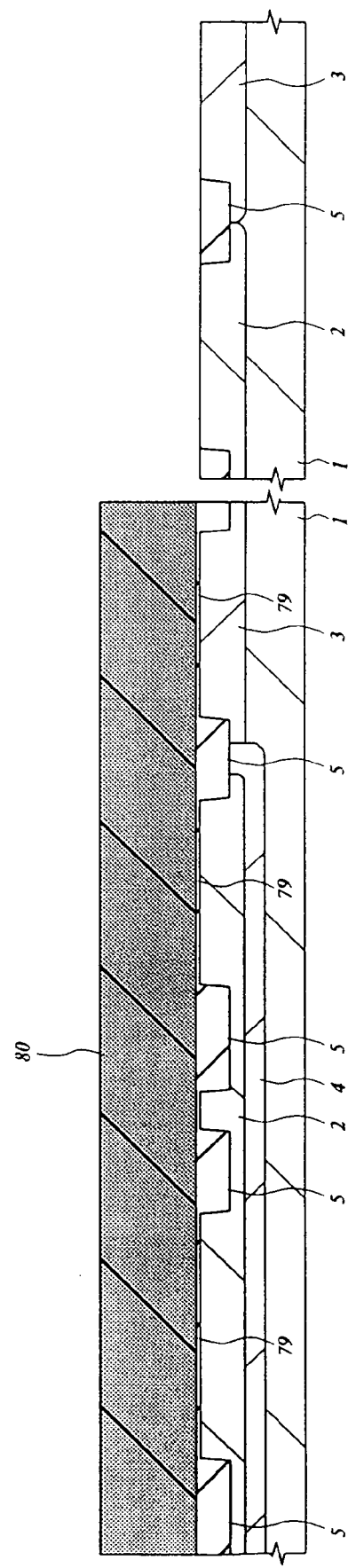

Then, as shown in FIG. 9, the region where the memory array (MARY) and the direct peripheral circuit are to be formed is covered with a photoresist 80 and the gate oxide film 79 on the surfaces of the p-type well 2 and the n-type well 3 of the logic integrated circuit part is removed by a HF (hydrofluoric acid)-based cleaning fluid. The boundary of the photoresist 80 is arranged over the element-separating groove 5 for separating the region where the memory array (MARY) and the direct peripheral circuit are to be formed from the logic integrated circuit part.

Figure 10:
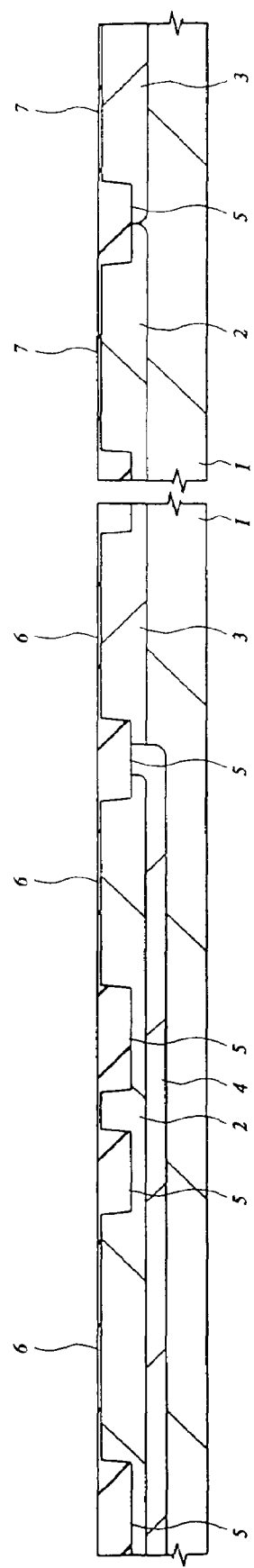

Then, as shown in FIG. 10, a second gate oxide film 7 having a thickness of about 4 nm is formed on the surface of the p-type well 2 and on the surface of the n-type well 3 of the logic integrated circuit part by performing the wet oxidation again. At this time, the gate oxide film 79, which is formed by the first wet oxidation on the surfaces of the p-type well 2 and the n-type well 3 in the region in which the memory array (MARY) and the direct peripheral circuit are to be formed, grows and becomes a first gate oxide film 6. Therefore, the thickness of the gate oxide film 79 formed by the first wet oxidation is required to be set so that the thickness becomes about 7 to 8 nm after the growth of the second wet oxidation.

Figure 11:
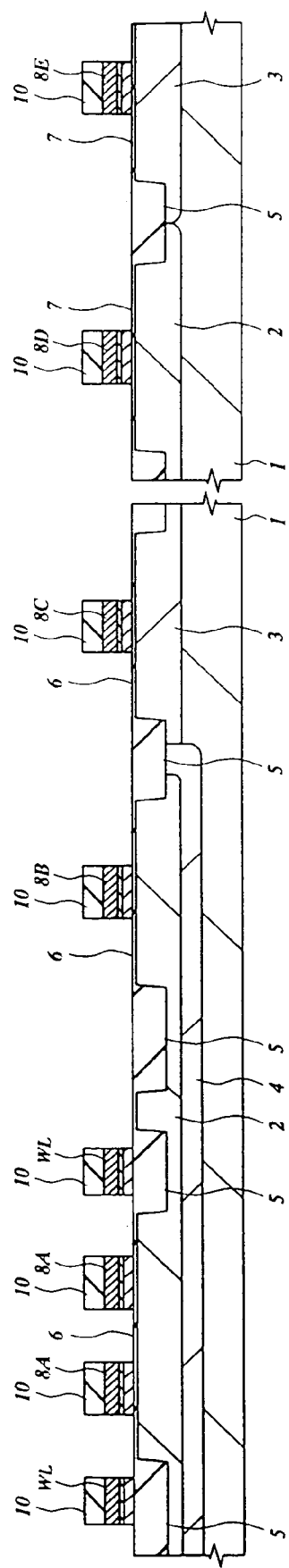

Then, as shown in FIG. 11, a gate electrode 8A (word line WL) is formed on the first gate oxide film 6 of the memory array (MARY), and gate electrodes 8B to 8E are formed on the gate oxide film 6 of the direct peripheral circuit and on the second gate oxide film 7 of the logic integrated circuit part. In order to form the gate electrode 8A (word line WL) and the gate electrodes 8B to 8E, first, a polycrystalline silicon film doped with P and having a thickness of about 70 nm is deposited on the semiconductor substrate 1 by the CVD method, and then a TiN film having a thickness of about 50 nm and a W film having a thickness of about 100 nm are formed on the polycrystalline silicon film by a sputtering method, and then further, a silicon nitride film 10 having a thickness of about 200 nm is formed thereon by the CVD method. Then, the silicon nitride film 10, the W film, the TiN film, and the polycrystalline silicon film are patterned by etching by using a photoresist as a mask. A gas made of $CF_4+CHF_3+Ar$, or a gas made of $CF_4+Ar$ is used for etching the silicon nitride film 10. A gas made of $Cl_2+SF_6$ is used for etching the W film. A gas made of $Cl_2$ is used for etching the TiN film. A gas made of $Cl_2+O_2$ is used for etching the polycrystalline silicon film.

Figure 12:
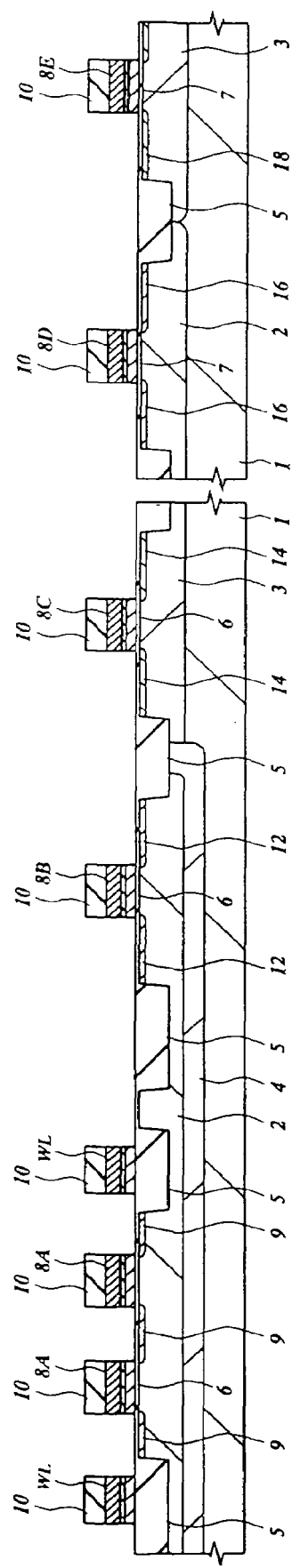

Then, as shown in FIG. 12, an n-type semiconductor region 9 (source, drain) of a memory cell selective MISFETQs is formed on the p-type well 2 of the memory array (MARY), and an n⁻-type semiconductor region 12 of an n-channel type MISFETQn1 is formed on the p-type well 2 of the direct peripheral circuit, and an n⁻-type semiconductor region 16 of an n-channel type MISFETQn2 is formed on the p-type well 2 of the logic integrated circuit part. Further, a p⁻-type semiconductor region 14 of a p-channel type MISFETQp1 is formed on the n-type well 2 of the direct peripheral circuit, and a p⁻-type semiconductor region 18 of a p-channel type MISFETQp2 is formed on the n-type well 2 of the logic integrated circuit part. The n-type semiconductor region 9 and the n⁻-type semiconductor regions 12, 16 are formed by ion-implanting P into the p-type well 2 by using the photoresist covering the n-type well 3 as a mask, and the p⁻-type semiconductor regions 14, 18 are formed by ion-implanting B into the n-type well 3 by using the photoresist covering the P-type well 2 as a mask.

Figure 13:
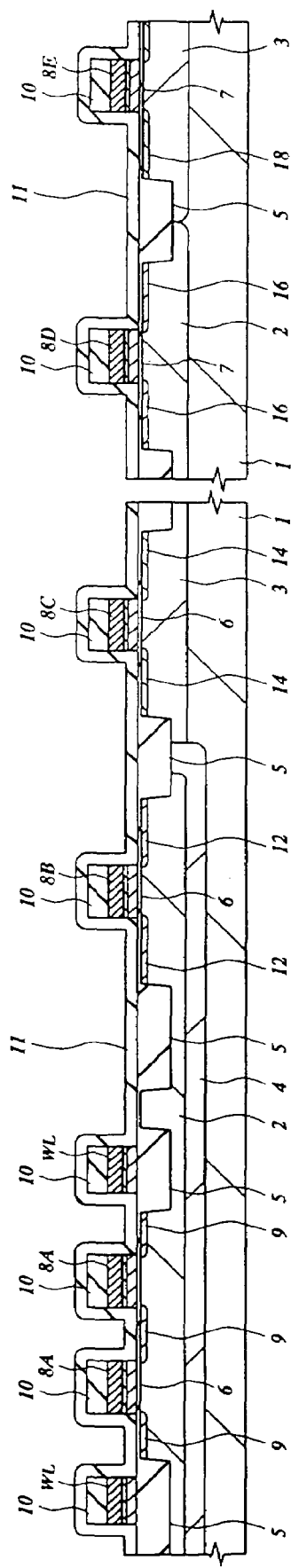
Figure 14:
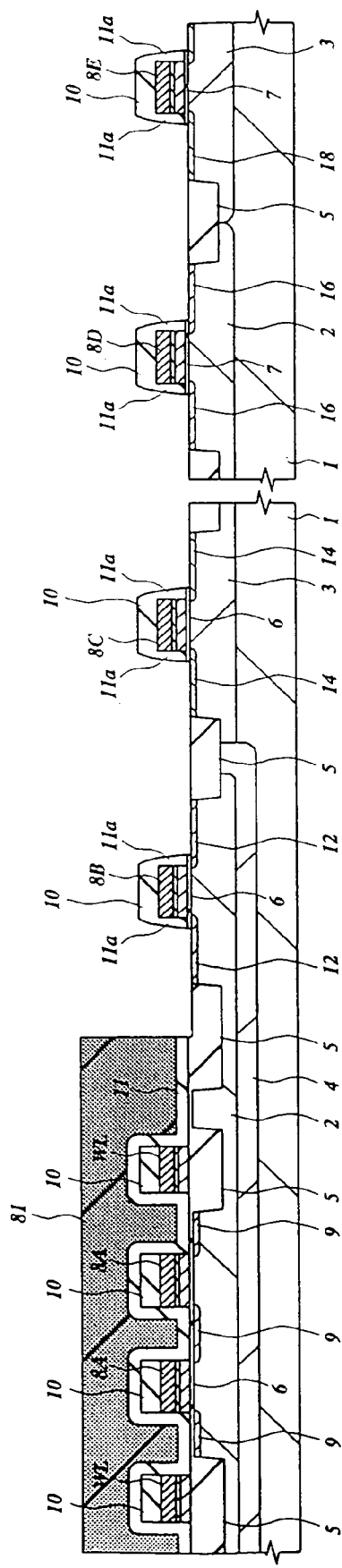

Then, as shown in FIG. 13, a silicon nitride film 11 having a thickness of about 10 to 50 nm is deposited on the semiconductor substrate 1 by the CVD method, and then as shown in FIG. 14, the silicon nitride film 11 formed on the direct peripheral circuit and the logic integrated circuit part is anisotropically etched with the memory array (MARY) covered with the photoresist 81 to form a side-wall spacer 11a on the side-wall of each of the gate electrodes 8B to 8E. At this time, the boundary of the photoresist 81 is arranged over the element-separating groove 5 for separating the memory array (MARY) from the direct peripheral circuit. In this etching, in order to minimize the amount of etching of the silicon oxide film buried in the element-separating groove 5 and the silicon nitride film 10 formed on the gate electrodes 8B to 8E, the amount of over-etching is minimized in the range of necessity and an etching gas (for example, $CH_2F_2$, $CH_3F$, or $Cl_2+O_2$) capable of increasing a selective ratio for the silicon oxide film is used.

Figure 15:
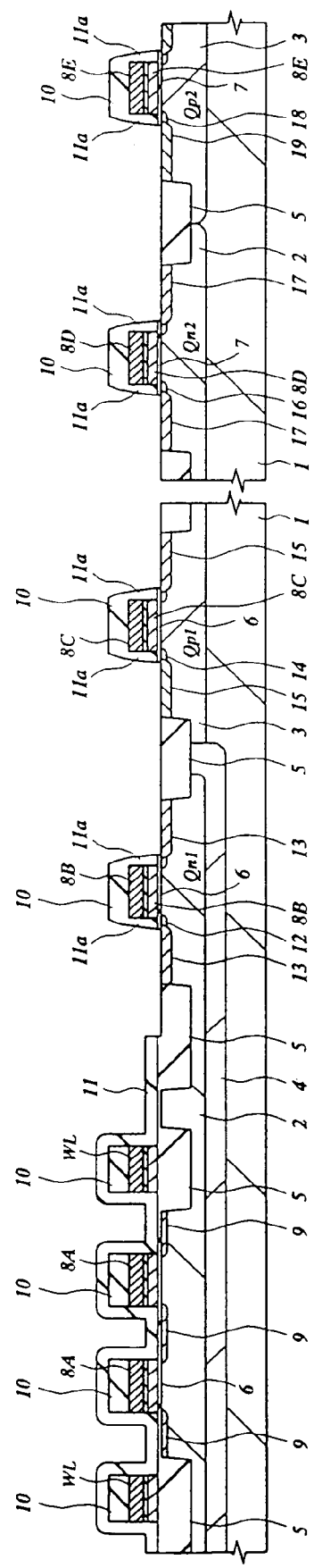

Then, as shown in FIG. 15, an n⁺-type semiconductor region 13 of n-channel type MISFETQn1 is formed on the p-type well 2 of the direct peripheral circuit, and a p⁺-type semiconductor region 15 of a p-channel type MISFETQp1 is formed on the n-type well 2 of the direct peripheral circuit. Further, an n⁺-type semiconductor region 17 of an n-channel type MISFETQn2 is formed on the p-type well 2 of the logic integrated circuit part, and a p⁺-type semiconductor region 19 of a p-channel type MISFETQp2 is formed on the n-type well 2 of the logic integrated circuit part. The n⁺-type semiconductor regions 13, 17 are formed by ion-implanting As (arsenic) into the p-type well 2, and the p⁺-type semiconductor regions 15, 19 are formed by ion-implanting B into the n-type well 3.

Figure 16:
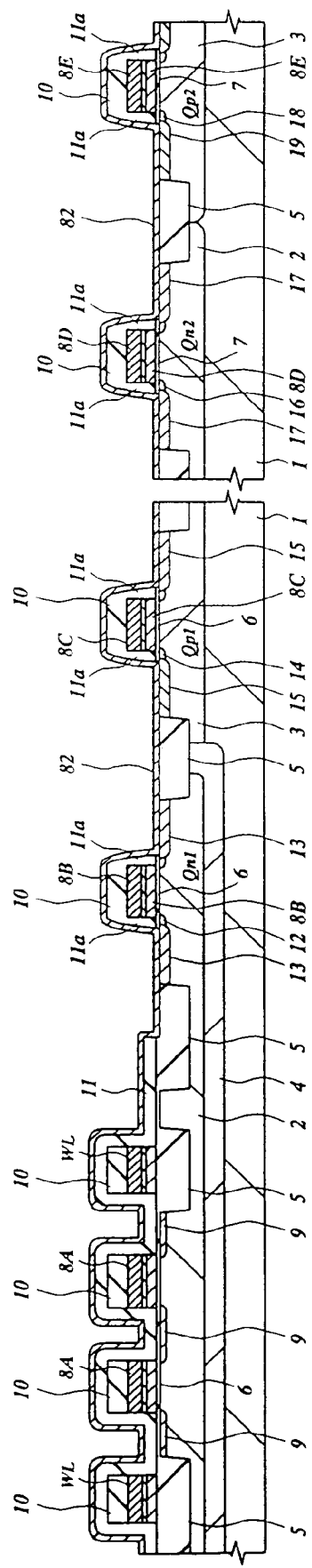
Figure 17:
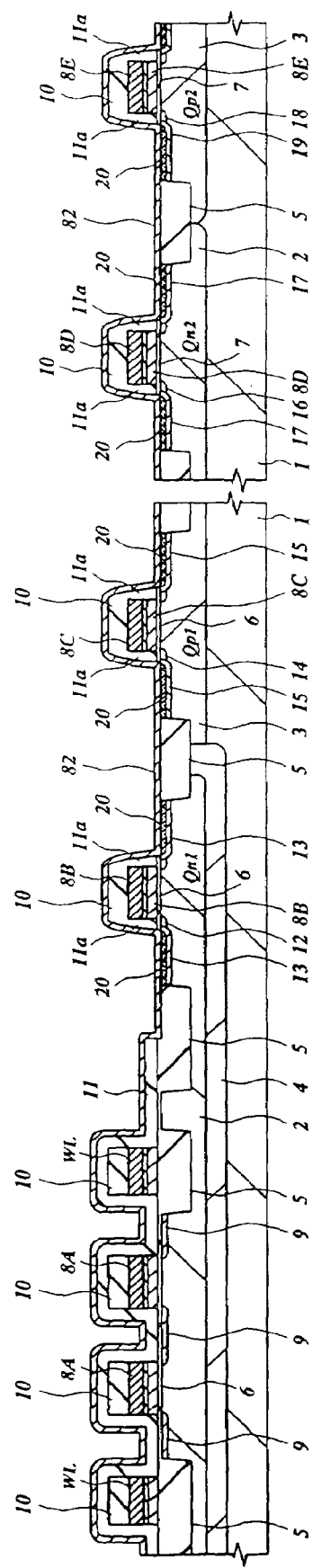

Then, as shown in FIG. 16, a Ti film 82 having a thickness of about 40 nm is deposited on the semiconductor substrate 1 by the sputtering method, and then is subjected to a heat treatment in a nitrogen atmosphere at a temperature of 600 to 700° C. As shown in FIG. 17, since the memory array (MARY) is covered with the silicon nitride film 11, a reaction to form silicide does not occur in this region, whereas the reaction to form silicide occurs at the positions where the semiconductor substrate 1 is exposed in the direct peripheral circuit and the logic integrated circuit part (n⁺-type semiconductor regions 13, 17, and the p⁺-type semiconductor regions 15, 19) to form a Ti silicide ($TiSi_2$) layer 20 on the surfaces thereof.

Figure 18:
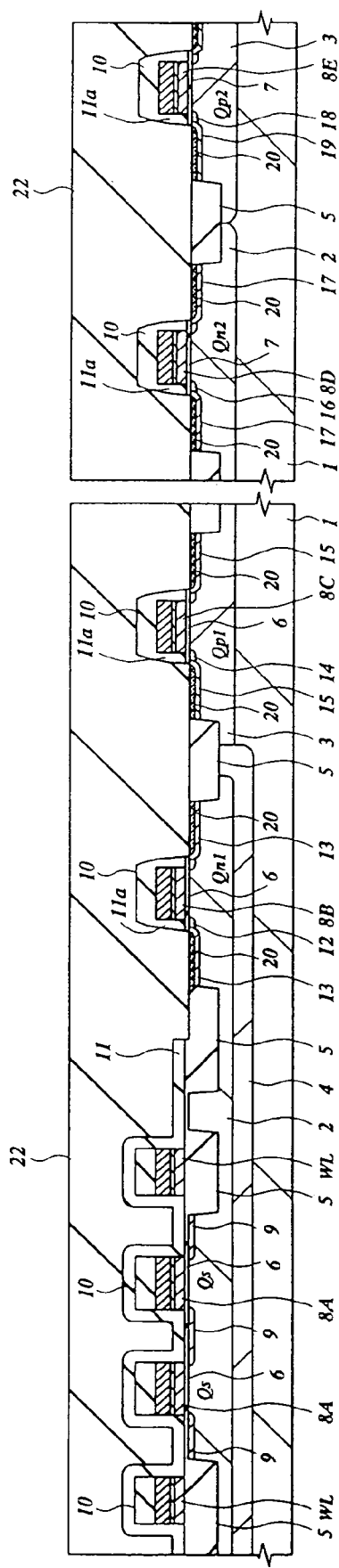

Then, an unreacted Ti film 82 is removed by wet etching, and then as shown in FIG. 18, a silicon oxide film 22 is deposited on the semiconductor substrate 1 by the CVD method and then the surface of the silicon oxide film 22 is planarized by the chemical mechanical polishing method.

Figure 19:
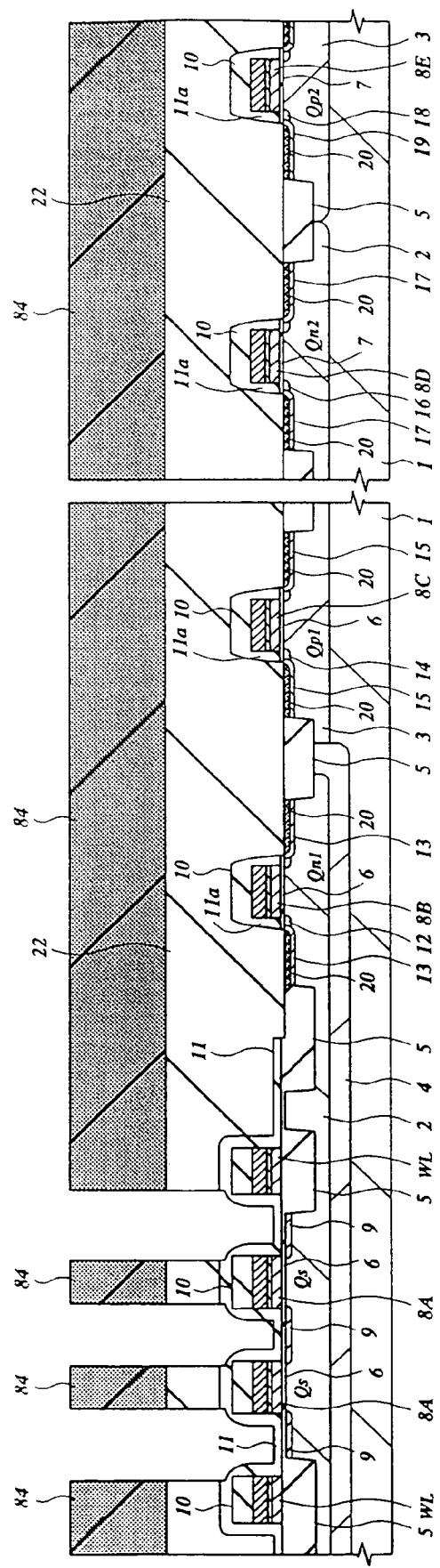

Then, as shown FIG. 19, the silicon oxide film 22 on top of the n-type semiconductor region 9 (source, drain) of the memory cell selective MISFETQs is removed by etching by using a photoresist 84 as a mask. This etching is performed under the condition that the etching rate of the silicon oxide film 22 for the silicon nitride films 10, 11 is increased to prevent the silicon nitride film 11 on the top of the n-type semiconductor region 9 from being removed.

Figure 20:
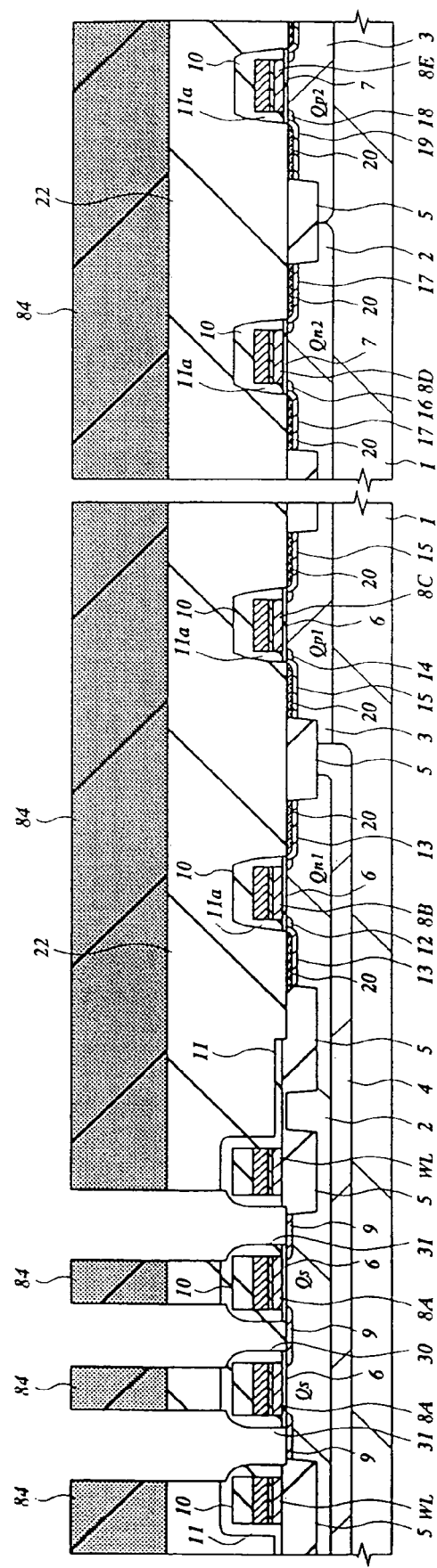

Next, as shown in FIG. 20, the silicon nitride film 11 and the second gate oxide film 7 on top of the n-type semiconductor region 9 (source, drain) of the memory cell selective MISFETQs are etched away by using the photoresist 84 as a mask to form a contact hole 30 over one of the source and the drain (n-type semiconductor region 9) and a contact hole 31 over the other of the source and the drain (n-type semiconductor region 9). In this etching, in order to minimize the amount of etching of the semiconductor substrate 1, the amount of over-etching is minimized in the range of necessity and an etching gas capable of increasing a selective ratio for the silicon is used. Further, this etching is performed under condition that the silicon nitride film 10 is anisotropically etched to leave the silicon nitride film 11 on the side wall of the gate electrode 8A (word line WL). In this way, the contact holes 30, 31 are formed in a self-alignment manner for the silicon nitride film 11 on the side wall of the gate electrode 8A (word line WL). In order to form the contact holes 30, 31 in a self-alignment manner for the silicon nitride film 10, it is also recommended that the silicon nitride film 11 be anisotropically etched away in advance to form a side-wall spacer on the side wall of the gate electrode 8A (word line WL).

Figure 21:
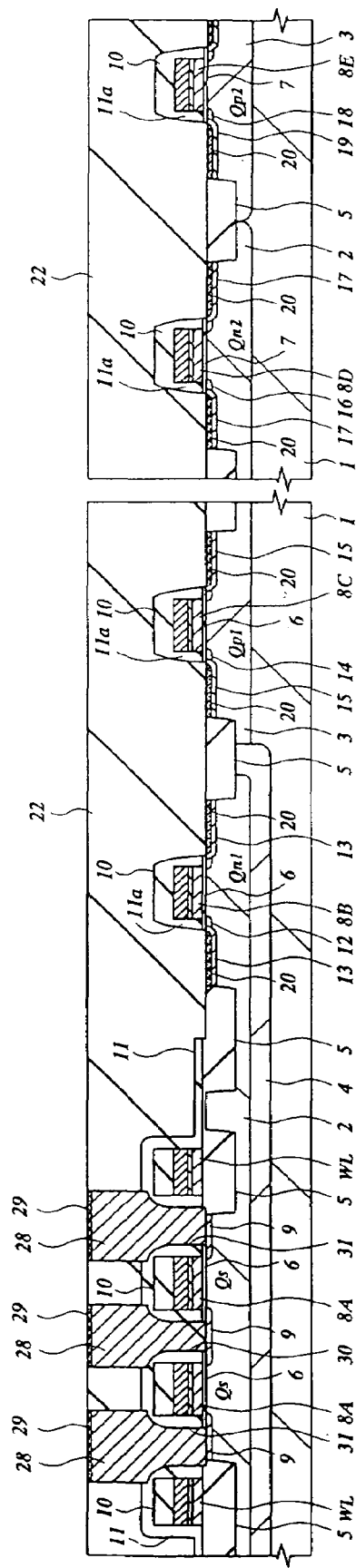

Next, as shown in FIG. 21, a plug 28 is buried in each of the contact holes 30, 31, and then a Ti silicide layer 29 is formed on the surface of the plug 28. The plug 28 is formed by depositing a polycrystalline silicon film doped with P on the top of the silicon oxide film 22 by the CVD method and then by polishing the polycrystalline silicon film by the chemical mechanical polishing method to leave the polycrystalline silicon film in the contact holes 30, 31. The P in the polycrystalline silicon film of the plug 28 is diffused into the n-type semiconductor region 9 (source, drain) from the bottom of the contact holes 30, 31 in the following high temperature process to reduce the resistance of the n-type semiconductor region 9. The Ti silicide layer 29 is formed by heat-treating a Ti film deposited on the top of the silicon oxide film 22 by the sputtering method in a nitrogen atmosphere at a temperature of 600 to 700° C. and then the unreacted Ti film is removed by wet etching.

Figure 22:
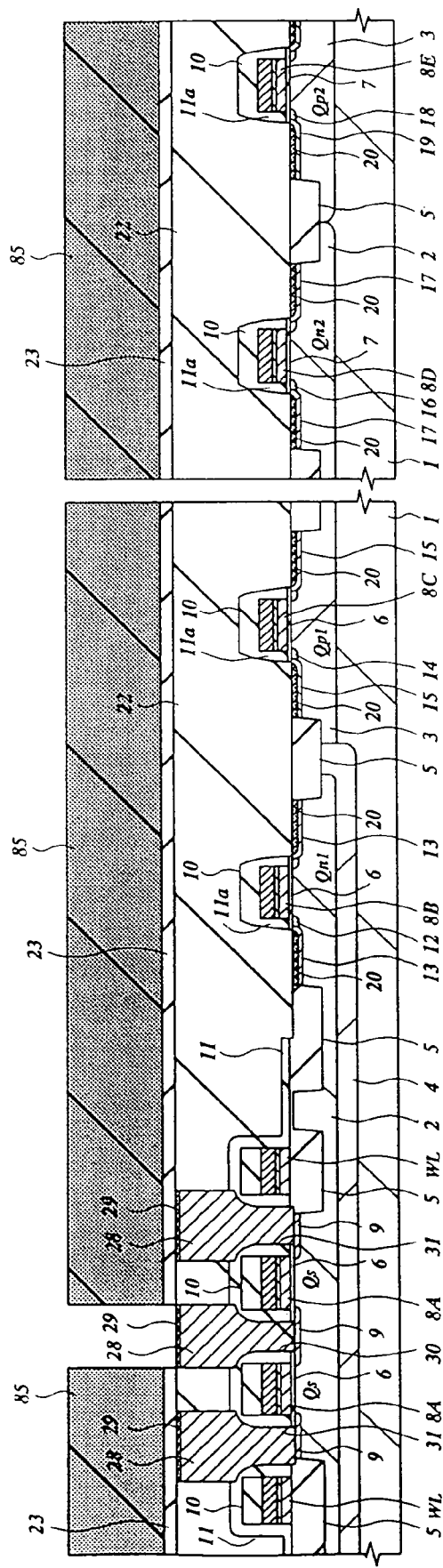

Then, as shown in FIG. 22, a silicon oxide film 23 is deposited on the top of the silicon oxide film 22 by the CVD method, and then the silicon oxide film 23 over the contact hole 30 is removed by etching by using a photoresist 85 as a mask.

Figure 23:
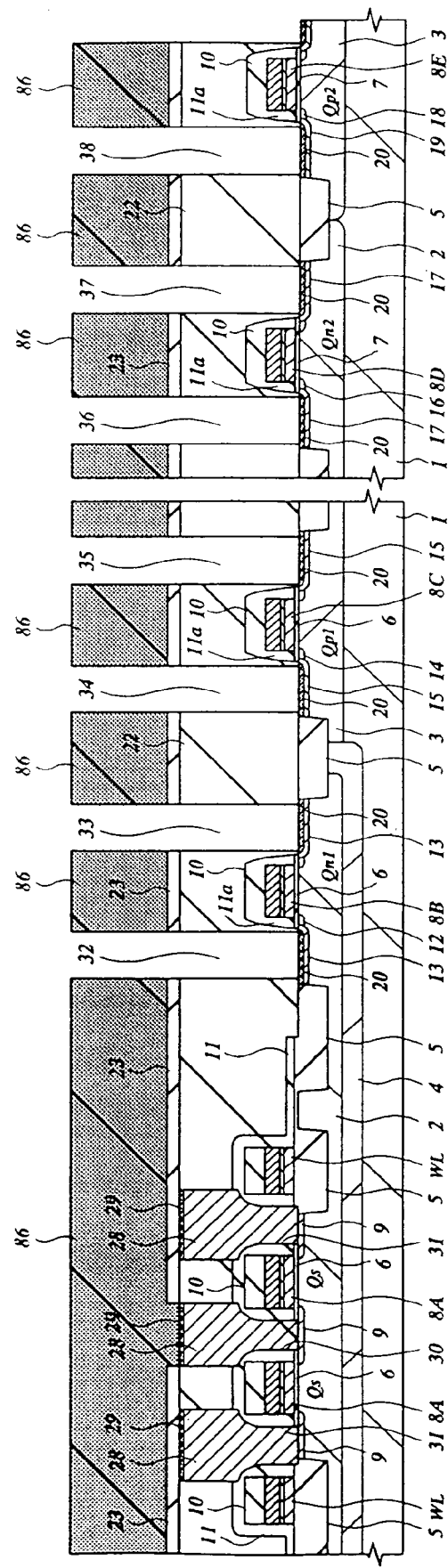

Then, as shown in FIG. 23, the silicon oxide films 23, 22 and the first gate oxide film 6 (the second gate oxide film 7) of the direct peripheral circuit and the logic integrated circuit part are etched away by using a photoresist 86 as a mask to form contact holes 32 to 38 over the n⁺-type semiconductor region 13 of the n-channel type MISFETQn1 and the p⁺-type semiconductor region 15 of the p-channel type MISFETQp1 of the direct peripheral circuit, and the n⁺-type semiconductor region 17 of the n-channel type MISFETQn2 and the p⁺-type semiconductor region 19 of the p-channel type MISFETQp2 of the logic integrated circuit part. This etching is performed under condition that the etching rate of the silicon oxide film for the silicon nitride film 10 and the side wall spacer 11a is increased to form the contact holes 32 to 38 in a self-alignment manner for the side-wall spacer 11a.

Figure 24:
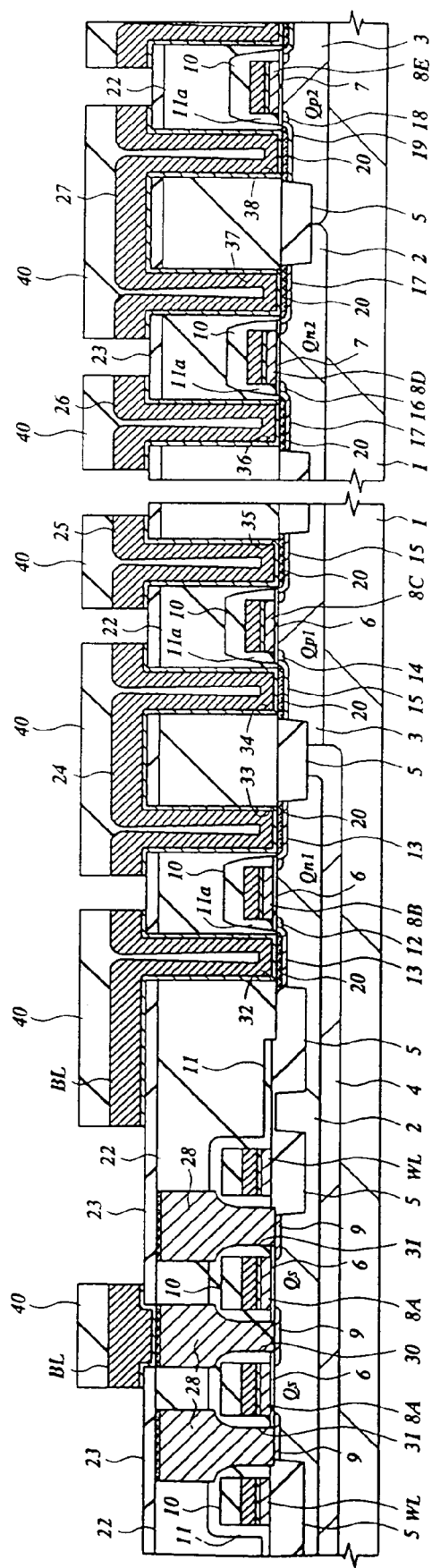

Then, as shown in FIG. 24, a bit line BL is formed on the top of the silicon oxide film 23 of the memory array (MARY) and first layer wirings 24 to 27 are formed on the tops of the silicon oxide films 23 of the direct peripheral circuit and the logic integrated circuit part. The bit line BL and the first layer wirings 24 to 27 are formed by depositing a TiN film and a W film on the top of the silicon oxide film 23 by the sputtering method and then by depositing a silicon nitride film 40 on the top of the W film by the CVD method and then by patterning these films by etching by using a photoresist as a mask.

Figure 25:
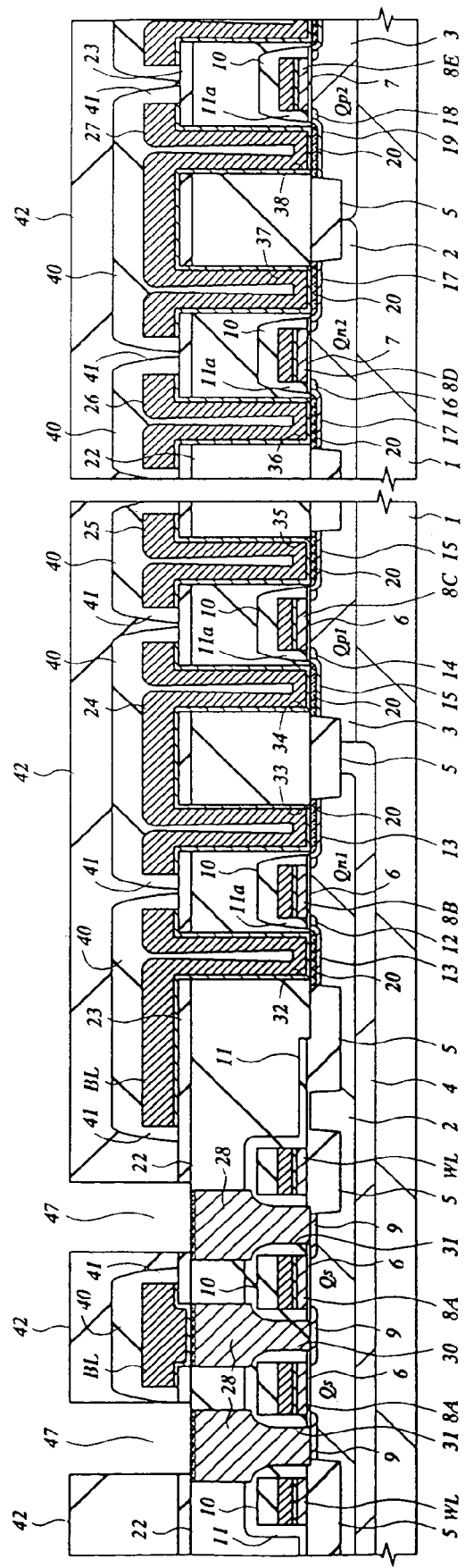

Then, as shown on FIG. 25, a side-wall spacer 41 is formed on each side wall of the bit line BL and the first layer wirings 24 to 27, and then a silicon oxide film 42 is deposited on the tops of the bit line BL and the first layer wirings 24 to 27 by the CVD method, and then the silicon oxide films 42, 23 over the contact hole 31 are etched away by using a photoresist as a mask to form a through hole 47. The side-wall spacer 41 is formed by anisotropically etching the silicon nitride film deposited on the tops of the bit line BL and the first layer wirings 24 to 27 by the CVD method. This etching for making the through hole 47 is performed under condition that the etching rate of the silicon oxide film for the silicon nitride film 40 and the side-wall spacer 41 is increased to form the through hole 47 in a self-alignment manner for the side-wall spacer 41.

Figure 26:
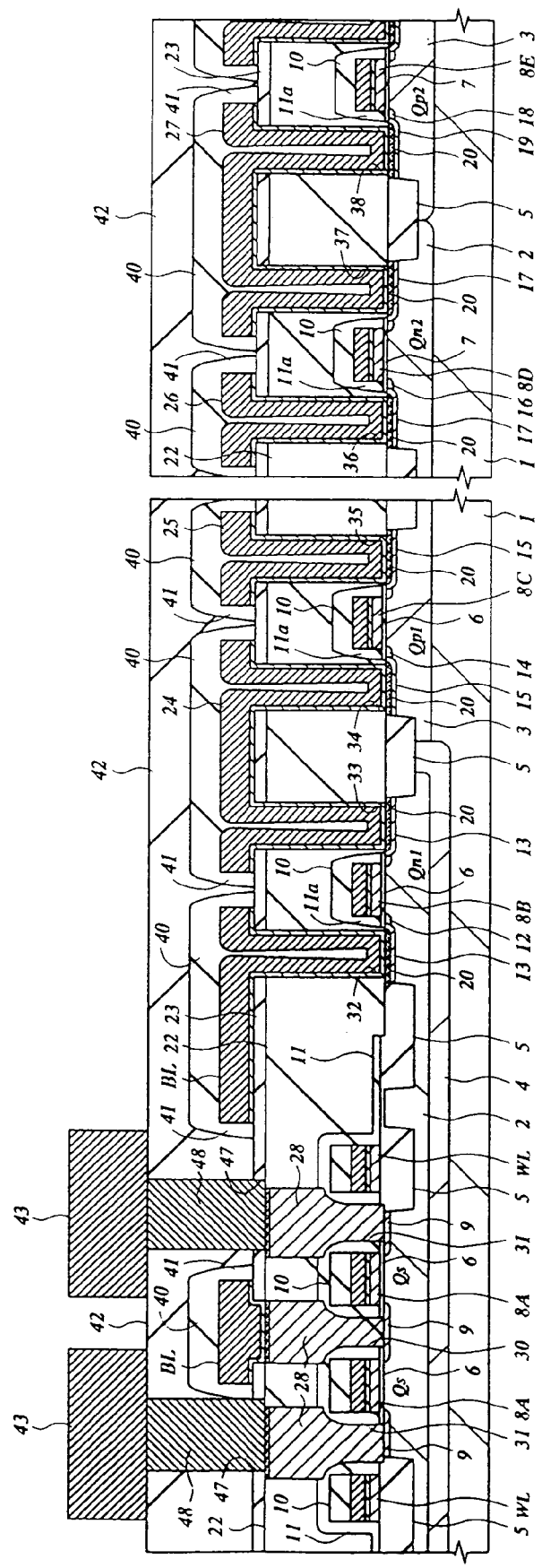

Then, as shown in FIG. 26, a plug 48 made of a W film is buried in the through hole 47, and then a lower electrode 43 (storing electrode) of an information storing capacitive element is formed thereon. The plug 48 is formed by depositing a W film on the top of the silicon oxide film 42 by the CVD method or by the sputtering method and then by polishing the W film by the chemical mechanical polishing method to leave the W film in the through hole 47. The lower electrode 43 is formed by depositing a W film on the top of the silicon oxide film 42 by the CVD method or by the sputtering method and then by patterning the W film by etching by using a photoresist as a mask.

Figure 27:
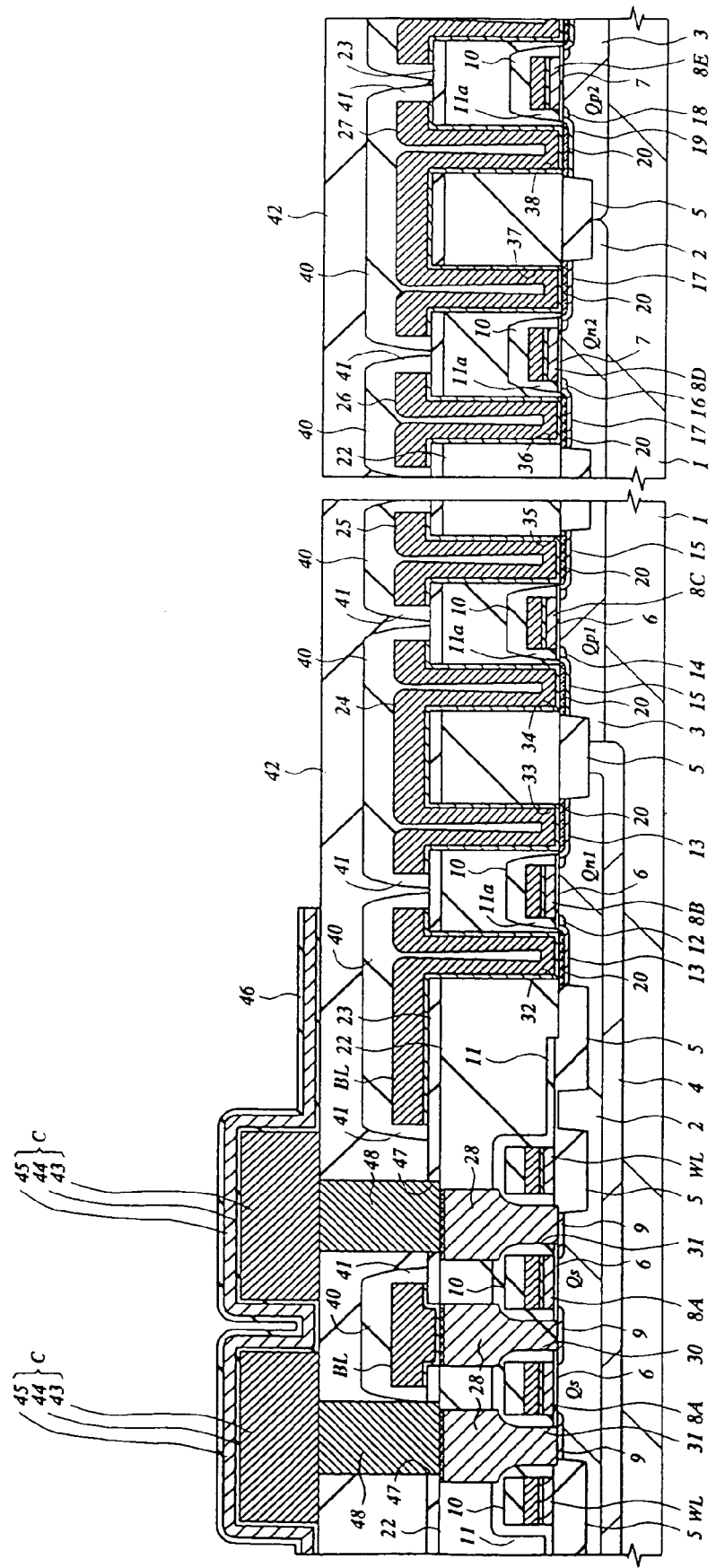

Then, as shown in FIG. 27, a capacitive insulating film 44 and an upper electrode (plate electrode) 45 of an information storing capacitive element C are formed on the top of the lower electrode (storing electrode) 43. The capacitive insulating film 44 and the upper electrode 45 are formed by depositing a tantalum oxide film on the top of the silicon oxide film 42 by the CVD method or by the sputtering method, and then by depositing a TiN film on the top of the tantalum oxide film by the sputtering method, and then by depositing a silicon nitride film 46 on the top of the TiN film by the CVD method, and then by patterning these films by etching by using a photoresist as a mask.

Figure 28:
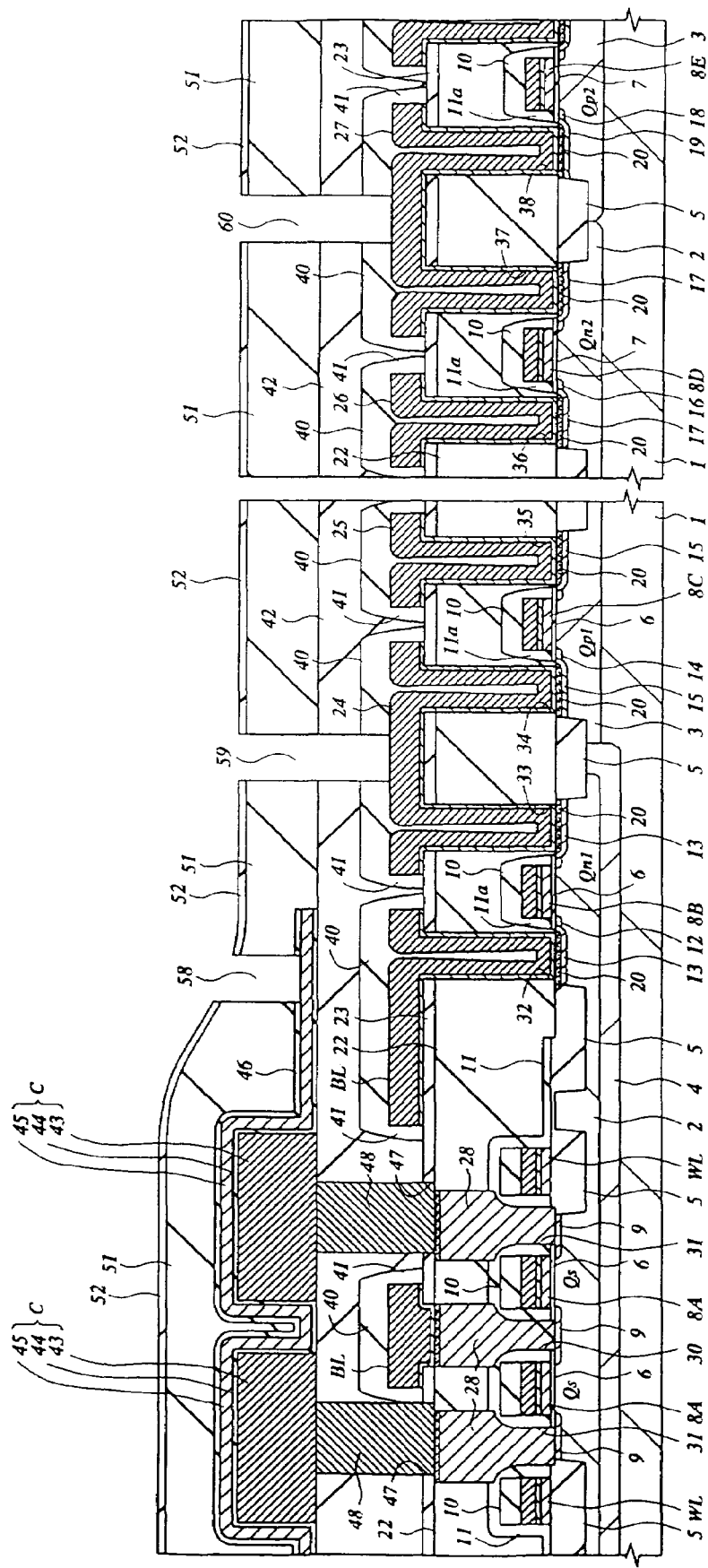

Then, as shown in FIG. 28, a spin-on-glass film 51 is formed on the top of the information storing capacitive element C by a spin coating method, and then a silicon oxide film 52 is deposited on the top of the spin-on-glass film 51 by the CVD method, and then the silicon oxide film 52, the spin-on-glass film 51, and the silicon nitride film 46 are etched away by using a photoresist as a mask to form a through hole 58 over the upper electrode 45 of the information storing capacitive element C. At this time, the silicon oxide film 52, the spin-on-glass film 51, the silicon oxide film 42, the silicon nitride film 40 of the direct peripheral circuit and the logic integrated circuit part are etched away at the same time to form a through hole 59 over the first layer wiring 24 of the direct peripheral circuit and a through hole 60 over the first layer wiring 27 of the logic integrated circuit part.

Figure 29:
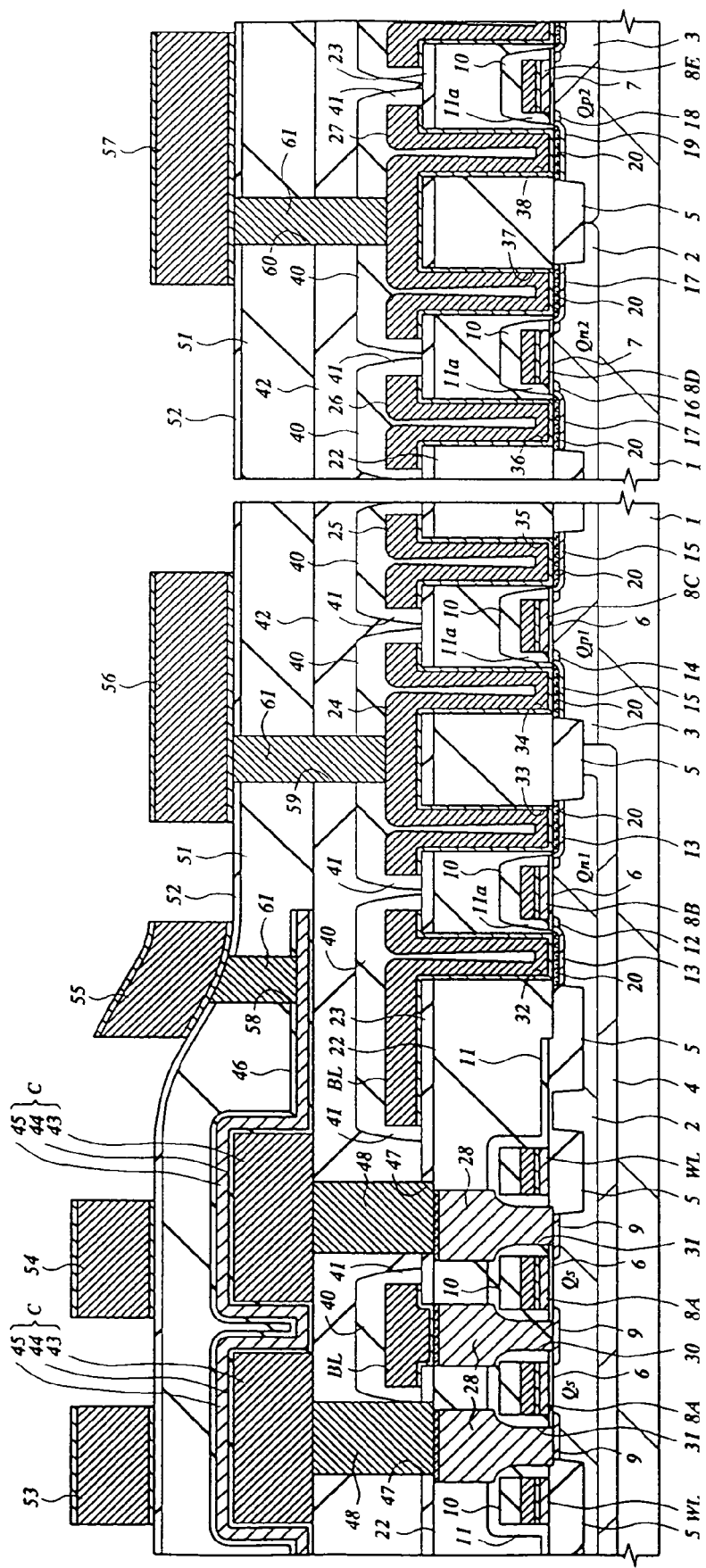

Then, as shown in FIG. 29, a plug 61 made of a W film is buried in each of the through holes 59, 60, and then second layer wirings 53 to 57 are formed on the top of the silicon oxide film 52. The second layer wiring 55 of the memory array (MARY) is electrically connected to the upper electrode 45 of the information storing capacitive element C through the through hole 58, and the second layer wiring 56 of the direct peripheral circuit is electrically connected to the first layer wiring 24 through the through hole 59, and the second layer wiring 57 of the logic integrated circuit part is electrically connected to the first layer wiring 27 through the through hole 60. The second layer wirings 53 to 57 are formed by depositing a TiN film, an Al alloy film, a TiN film on the top of the silicon oxide film 52 by the sputtering method and then by patterning these films by etching by using a photoresist as a mask.

Figure 30:
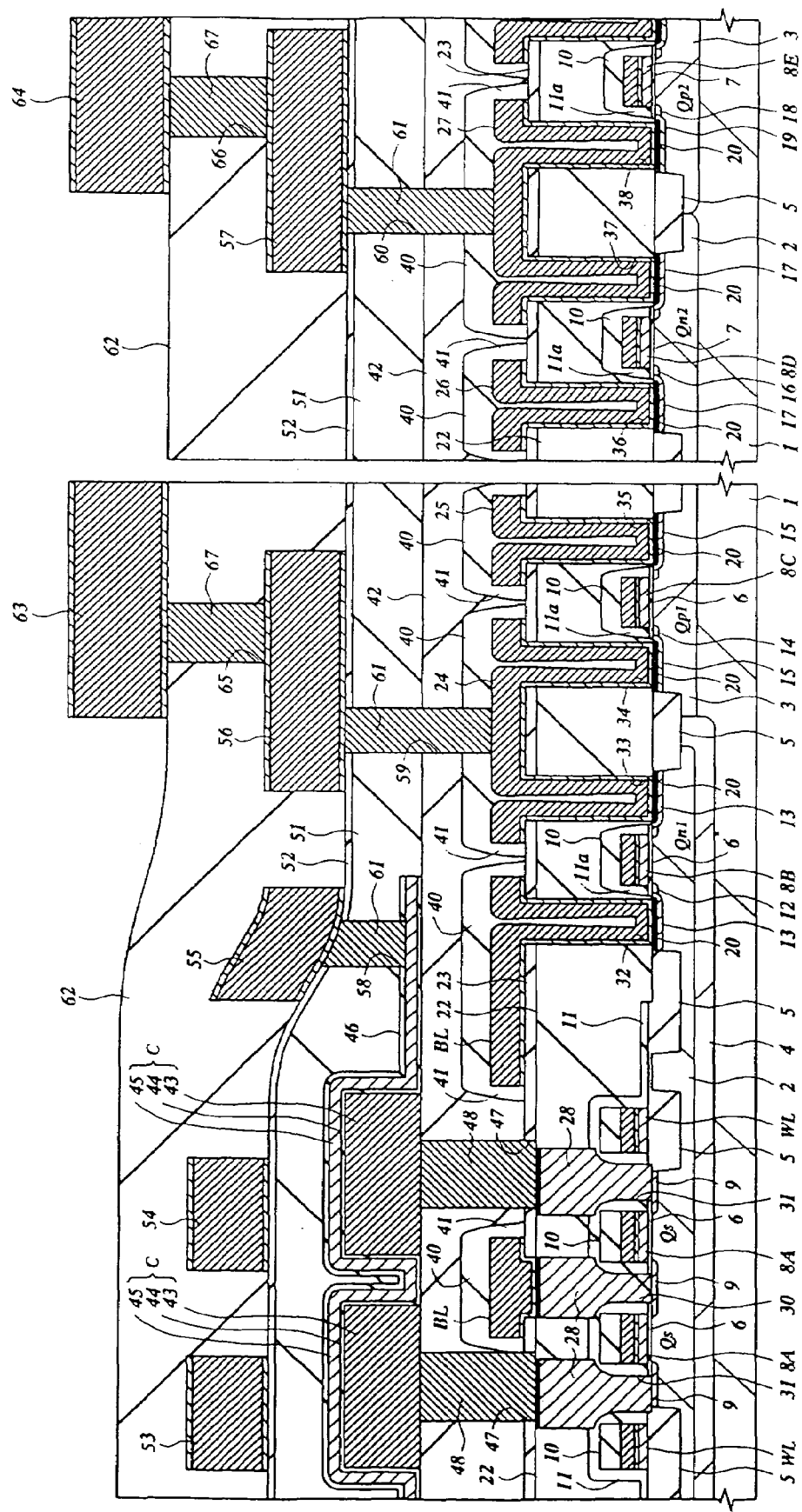

Then, as shown in FIG. 30, a silicon oxide film 62 is deposited on the tops of the second layer wirings 53 to 57, and then third layer wirings 63, 64 are formed on the top of the silicon oxide film 62. The third layer wirings 63, 64 are formed by the following steps: depositing a silicon oxide film 62 on the top of the second layer wirings 53 to 57 by the CVD method; etching away the silicon oxide film 62 by using a photoresist as a mask to form a through hole 65 over the second layer wiring 56 of the direct peripheral circuit and a through hole 66 over the second layer wiring 57 of the logic integrated circuit part; burying a plug 67 made of a W film in each of the through holes 65, 66; depositing a TiN film, an Al alloy film, a TiN film on the top of the silicon oxide film 62 by the sputtering method; and then patterning these films by etching by using a photoresist as a mask. The third layer wiring 63 of the direct peripheral circuit is electrically connected to the second layer wiring 56 through the through hole 65 and the third layer wiring 64 of the logic integrated circuit part is electrically connected to the second layer wiring 57 through the through hole 66.

Then, a silicon oxide film 68 is deposited on the top of the third layer wiring 64 of the logic integrated circuit part and then a fourth layer wiring 69 is formed on the top of the silicon oxide film 68, whereby a semiconductor integrated circuit device shown in FIG. 3 is almost completed. The fourth layer wiring 69 is formed by the following steps: depositing the silicon oxide film 68 on the top of the third layer wirings 56, 57 by the CVD method; etching away the silicon oxide film 68 by using a photoresist as a mask to form a through hole 70 over the third layer wiring 64 of the logic integrated circuit part; burying a plug 71 made of a W film in the through hole 70; depositing a TiN film, an Al alloy film, a TiN film on the top of the silicon oxide film 70 by the sputtering method; and then patterning these films by etching by using a photoresist as a mask. The fourth layer wiring 69 is electrically connected to the third layer wiring 64 through the through hole 70.

The semiconductor integrated circuit device of the present preferred embodiment constituted as described above can produce the following effects.

(1) Since the thickness of the gate oxide film of the MISFET of the logic integrated circuit part is reduced and the gate electrode is made of a conductive material having a sheet resistance of 2Ω/□ or less and the source and the drain are made of silicide, it is possible to realize the high speed operation of the logic integrated circuit.

(2) Since the source and the drain of the memory cell selective MISFET of the memory cell of the DRAM are not made of the silicide, it is possible to prevent an increase in leak current caused by the silicide and a decrease in refresh characteristics.

(3) Since the gate electrode of the memory cell selective MISFET of the memory cell of the DRAM is made of a conductive material having a sheet resistance of 2Ω/□ or less, it is possible to reduce a gate delay. Since it is not required to back the word line with the metal wiring, it is possible to simplify the manufacturing process of the DRAM and to improve manufacturing yield.

While, up to this point, the invention achieved by the present inventor has been described specifically on the basis of its preferred embodiment, it will be understood that it is not intended to limit the present invention to the preferred embodiment described above, and it is needless to say that the present invention can be modified further in various manners within the spirit and scope of the present invention.

In the preferred embodiment described above, the sense amplifier, the row decoder, and the column decoder of the DRAM are defined as the direct peripheral circuit, but for example, the sense amplifier, the row decoder, the column decoder, the logic circuit, the address selective circuit, the reading amplifier, and the writing amplifier may be defined as the direct peripheral circuit, and the input/output circuit may be defined as the indirect peripheral circuit.

In the preferred embodiment described above, the silicide layer is formed on the surfaces of the source and the drain of the MISFET of the direct peripheral circuit of the DRAM and on the surfaces of the source and the drain of the MISFET of the indirect peripheral circuit of the DRAM and on the surfaces of the source and the drain of the MISFET of the logic integrated circuit, and the silicide layer is not formed on the surfaces of the source and the drain of the memory cell selective MISFET of the memory cell of the DRAM. However, for example, the silicide layer may be formed on the surfaces of the source and the drain of the MISFET of the indirect peripheral circuit of the DRAM and on the surfaces of the source and the drain of the MISFET of the logic integrated circuit, and the silicide layer need not be formed on the surfaces of the source and the drain of the memory cell selective MISFET of the memory cell of the DRAM and on the surfaces of the source and the drain of the MISFET of the direct peripheral circuit of the DRAM. In this case, since the memory array and the direct peripheral circuit of the DRAM can share the manufacturing process, it is possible to put the memory array and the direct peripheral circuit of the DRAM into circulation as a DRAM core by itself. Further, a logic integrated circuit part having the source and the drain made of the silicide can be put into circulation as a logic core by itself.

In the preferred embodiment described above, Ti is used as the material of the silicide, but the other material, for example, Co (cobalt) may be used.

The present invention can realize the high speed peration of the logic integrated circuit and can prevent deterioration in refresh characteristics of the DRAM, and thus can suitably be applied to a semiconductor integrated circuit device having a system-on-chip structure in which the DRAM and the logic integrated circuit are mixedly mounted on a chip.

The invention claimed is:

1. A method of manufacturing a semiconductor integrated circuit device having first MISFETs and second MISFETs formed over a semiconductor substrate, comprising the steps of
   (a) providing the semiconductor substrate including a first area and a second area;
   (b) forming a first gate electrode of the first MISFET in the first area and a second gate electrode of the second MISFET in the second area;
   (c) forming a first semiconductor region and a second semiconductor region of the first MISFET in the first area;
   (d) forming a third semiconductor region and a fourth semiconductor region of the second MISFET in the second area;
   (e) forming a first insulating film over the first gate electrode, the first and second semiconductor regions, the second gate electrode, and the third and fourth semiconductor regions;
   (f) removing the first insulating film over the third and fourth semiconductor regions in the second area, leaving the first insulating film in the first area;
   (g) after the step (f), forming a metal film over the first insulating film in the first area and on the third and fourth semiconductor regions in the second area;
   (h) performing a thermal treatment to form silicide films of the metal film on the third and fourth semiconductor regions, and not on the first and second semiconductor regions;
   (i) after the step (h), removing a part of the metal film which is not silicided in the step (h);
   (j) after the step (i), forming an interlayer insulating film over the first area and the second area;
   (k) polishing the surface of the interlayer insulating film;
   (l) etching the interlayer insulating film to form a first contact hole and a second contact hole in a self-alignment manner with the adjacent first gate electrodes in the first area; and
   (m) forming a first conductive film and a second conductive film in the first contact hole and the second contact hole respectively, electrically connected to the first and second semiconductor regions respectively.

2. A method of manufacturing a semiconductor integrated circuit device according to claim 1, wherein
   after the step (e), a first cap insulating film and a first sidewall of the first gate electrode are formed;
   after the step (f), a second cap insulating film and a second sidewall of the second gate electrode are formed; and
   the first cap insulating film, the first sidewall, the second cap insulating film, and the second sidewall are comprised of the first insulating film.

3. A method of manufacturing a semiconductor integrated circuit device according to claim 2, wherein in the step (l), an etching rate of the interlayer insulating film is larger than an etching rate of the first cap insulating film and the first sidewall.

4. A method of manufacturing a semiconductor integrated circuit device according to claim 3, wherein in the step (h), the first insulating film in the first area prevents the metal film from silicidating on the first and second semiconductor regions.

5. A method of manufacturing a semiconductor integrated circuit device according to claim 4, wherein
   the semiconductor substrate is comprised of silicon;
   after the step (f), the third and the fourth semiconductor regions are exposed; and
   after the step (g), the metal film is directly contacted with each of the third and fourth semiconductor regions.

6. A method of manufacturing a semiconductor integrated circuit device according to claim 5, wherein the metal film is comprised of titanium or cobalt.

7. A method of manufacturing a semiconductor integrated circuit device according to claim 1, wherein
   the semiconductor integrated circuit device has a DRAM; and
   the first area is a memory cell region of the DRAM.

8. A method of manufacturing a semiconductor integrated circuit device according to claim 7, after the step (l), further comprising the steps of
   (m) forming a bit line of the DRAM over the interlayer insulating film; and (n) forming a capacitor element over the interlayer insulating film;

wherein the bit line is electrically connected to the first conductive film; and a lower electrode of the capacitor element is electrically connected to the second conductive film.

9. A method of manufacturing a semiconductor integrated circuit device according to claim 8, wherein the semiconductor integrated circuit device has a logic circuit region; and the second area is the logic circuit region.

10. A method of manufacturing a semiconductor integrated circuit device according to claim 8, wherein the second area is a peripheral circuit region of the DRAM.

11. A method of manufacturing a semiconductor integrated circuit device according to claim 1, further comprising the steps of (o) forming a third contact hole and a fourth contact hole in the second area; and (p) forming a third conductive film and a fourth conductive film in the third contact hole and the fourth contact hole;

wherein the third conductive film and the fourth conductive film are electrically connected to the third semiconductor region and the fourth semiconductor region respectively.

12. A method of manufacturing a semiconductor integrated circuit device having a memory cell area of a DRAM and a logic circuit area, comprising the steps of (a) providing a semiconductor substrate comprised of silicon;

(b) forming a word line of a memory cell selecting transistor and a gate electrode of a logic circuit MISFET in the memory cell area and the logic circuit area respectively;

(c) forming first source and a drain regions of the memory cell selecting transistor in the memory cell area;

(d) forming second source and a drain regions of a logic circuit MISFET in the logic circuit area;

(e) forming a first insulating film over the word line, the first source and drain regions, the gate electrode, and the second source and drain regions;

(f) removing the first insulating film over the second source and drain regions, leaving the first insulating film in the memory cell area;

(g) after the step (f), forming a metal film over the first insulating film in the memory cell area and on the second source and drain regions;

(h) performing a thermal treatment to form silicide films of the metal film on the second source and drain regions;

(i) after the step (h), removing a part of the metal film which is not silicided in the step (h);

(j) after the step (i), forming an interlayer insulating film over the memory cell area and the logic circuit area;

(k) polishing the surface of the interlayer insulating film;

(l) etching the interlayer insulating film to form a first contact hole and a second contact hole in a self alignment manner with the adjacent word lines in the memory cell area;

(m) forming a first conductive film and a second conductive film in the first contact hole and the second contact hole respectively, wherein the first conductive film is electrically connected to one of the first source and drain regions; and the second conductive film is electrically connected to the other of the first source and drain regions;

(n) etching the interlayer insulating film to form a third contact hole and a fourth contact hole in the logic circuit area;

(o) forming a third conductive film and a fourth conductive film in the third contact hole and the fourth contact hole respectively, wherein the third conductive film is electrically connected to one of the second source and drain regions; and the fourth conductive film is electrically connected to the other of the second source and drain regions;

(p) forming a bit line of the DRAM over the interlayer insulating film in the memory cell area, electrically connected to the first conductive film; and (q) forming a capacitor element of the DRAM over the interlayer insulating film in the memory cell area, electrically connected to the second conductive film;

wherein after the step (f), a cap insulating film and a sidewall of the word line, made of the first insulating film, are formed;

in the step (l), an etching rate of the interlayer insulating film is greater than an etching rate of the cap insulating film and the sidewall of the word line; and the first insulating film prevents the metal film from contacting the first source and drain regions.

13. A method of manufacturing a semiconductor integrated circuit device according to claim 12, wherein in the step (h), the first insulating film in the memory cell area prevents the metal film from silicidating on the first source and drain regions.

* * * * *